(12) United States Patent  
Wright et al.

(10) Patent No.: US 10,739,680 B2  
(45) Date of Patent: Aug. 11, 2020

(54) CROSS-LINKABLE FLUORINATED PHOTOPOLYMER

(71) Applicant: Orthogonal, Inc., Rochester, NY (US)

(72) Inventors: Charles Warren Wright, Fairport, NY (US); Douglas Robert Robello, Webster, NY (US); John Andrew Defranco, Rochester, NY (US); Diane Carol Freeman, Pittsford, NY (US); Frank Xavier Byrne, Webster, NY (US)

(73) Assignee: Orthogonal, Inc., Rochester, NY (US)

( * ) Notice: Subject to any disclaimer, the term of this patent is extended or adjusted under 35 U.S.C. 154(b) by 0 days.

(21) Appl. No.: 16/371,372

(22) Filed: Apr. 1, 2019

(65) Prior Publication Data

US 2019/0227436 A1    Jul. 25, 2019

Related U.S. Application Data

(63) Continuation of application No. 15/924,829, filed on Mar. 19, 2018, now Pat. No. 10,289,000, which is a (Continued)

(51) Int. Cl.
*G03F 7/038* (2006.01)
*G03F 7/40* (2006.01)
(Continued)

(52) U.S. Cl.
CPC .......... *G03F 7/0388* (2013.01); *C08F 220/34* (2013.01); *G03F 7/0046* (2013.01);
(Continued)

(58) Field of Classification Search
CPC ...... G03F 7/004; G03F 7/0388; G03F 7/0046; G03F 7/0048; G03F 7/0758; G03F 7/30;
(Continued)

(56) References Cited

U.S. PATENT DOCUMENTS 3,865,597 A    2/1975    Broyde
4,529,783 A    7/1985    Tsunoda et al.
(Continued)

FOREIGN PATENT DOCUMENTS

EP    0 430 722 A2    12/1990
EP    1 251 399 A2    10/2002
(Continued)

OTHER PUBLICATIONS

International Search Report and Written Opinion of the International Searching Authority for corresponding International Patent Application No. PCT/US2014/047800 dated Nov. 25, 2014, 12 pgs.
(Continued)

*Primary Examiner* — Amanda C. Walke
(74) *Attorney, Agent, or Firm* — Merchant & Gould P.C.

(57) ABSTRACT

A photosensitive composition is disclosed including a fluorinated photo cross-linkable polymer provided in a fluorinated solvent such as a hydrofluoroether. The photo cross-linkable polymer includes a first repeating unit having a fluorine-containing group but not a cinnamate group, and a second repeating unit having a fluorine-containing cinnamate group. The polymer has a total fluorine content in a range of 30 to 60% by weight. The composition can be used to form patterned barrier or dielectric structures over substrates and devices such as organic electronic devices.

11 Claims, 5 Drawing Sheets

Related U.S. Application Data continuation of application No. 15/117,032, filed as application No. PCT/US2015/014425 on Feb. 4, 2015, now Pat. No. 9,958,778.

(60) Provisional application No. 61/937,122, filed on Feb. 7, 2014.

(51) Int. Cl.
| | |
|---|---|
| *G03F 7/20* | (2006.01) |
| *G03F 7/30* | (2006.01) |
| *H01L 21/027* | (2006.01) |
| *C08F 220/34* | (2006.01) |
| *G03F 7/004* | (2006.01) |
| *G03F 7/075* | (2006.01) |
| *H01L 21/3105* | (2006.01) |
| *H01L 21/311* | (2006.01) |
| *G03F 7/11* | (2006.01) |

(52) U.S. Cl.
CPC ............ *G03F 7/0048* (2013.01); *G03F 7/038* (2013.01); *G03F 7/0758* (2013.01); *G03F 7/11* (2013.01); *G03F 7/20* (2013.01); *G03F 7/30* (2013.01); *G03F 7/40* (2013.01); *H01L 21/0274* (2013.01); *H01L 21/3105* (2013.01); *H01L 21/31055* (2013.01); *H01L 21/31127* (2013.01)

(58) Field of Classification Search
CPC .......... G03F 7/40; G03F 7/11; H01L 21/0274; H01L 21/3105; H01L 21/31055; H01L 21/31127; C03F 220/34
USPC ...................................................... 430/322
See application file for complete search history.

(56) References Cited

U.S. PATENT DOCUMENTS

| | | | |
|---|---|---|---|
| 4,647,689 | A | 3/1987 | Micinski |
| 4,965,171 | A | 10/1990 | Kawabata et al. |
| 5,250,395 | A | 10/1993 | Allen et al. |
| 5,286,803 | A | 2/1994 | Lindsay et al. |
| 5,395,733 | A | 3/1995 | Maemoto et al. |
| 5,650,456 | A | 7/1997 | Yun et al. |
| 5,693,928 | A | 12/1997 | Egitto et al. |
| 5,701,055 | A | 12/1997 | Nagayama et al. |
| 5,942,372 | A | 8/1999 | West et al. |
| 5,994,430 | A | 11/1999 | Ding et al. |
| 6,136,498 | A | 10/2000 | Jagannathan et al. |
| 6,229,055 | B1 | 5/2001 | Klaubert et al. |
| 6,306,563 | B1 | 10/2001 | Xu et al. |
| 6,646,068 | B2 | 11/2003 | Chisholm et al. |
| 6,693,296 | B1 | 2/2004 | Tyan |
| 6,884,562 | B1 * | 4/2005 | Schadt, III ............ G03F 7/0046 430/270.1 |
| 7,029,945 | B2 | 4/2006 | Veres et al. |
| 7,261,993 | B2 | 8/2007 | Schadt, III et al. |
| 7,632,630 | B2 | 12/2009 | Mori et al. |
| 7,858,970 | B2 | 12/2010 | Shukla et al. |
| 7,892,720 | B2 | 2/2011 | Eriguchi et al. |
| 8,334,456 | B2 | 12/2012 | Zhu et al. |
| 8,338,529 | B2 | 12/2012 | Hoshino et al. |
| 8,404,844 | B2 | 3/2013 | Kastler et al. |
| 8,411,489 | B2 | 4/2013 | Shukla et al. |
| 8,446,301 | B2 | 5/2013 | He et al. |
| 8,551,676 | B2 | 10/2013 | Nakashima et al. |
| 8,765,356 | B2 | 7/2014 | Green et al. |
| 8,936,900 | B2 | 1/2015 | Jain et al. |
| 9,122,167 | B2 * | 9/2015 | Defranco .............. G03F 7/0046 |
| 9,298,088 | B2 | 3/2016 | Robello et al. |
| 2002/0055059 | A1 | 5/2002 | Nishimura et al. |
| 2002/0113241 | A1 | 8/2002 | Kubota |
| 2002/0161068 | A1 | 10/2002 | Watanabe et al. |
| 2003/0175002 | A1 | 9/2003 | Andrews et al. |
| 2003/0211417 | A1 | 11/2003 | Fryd et al. |
| 2003/0215735 | A1 | 11/2003 | Wheland et al. |
| 2003/0219675 | A1 | 11/2003 | Montgomery et al. |
| 2005/0181299 | A1 | 8/2005 | Trefonas et al. |
| 2005/0196969 | A1 | 9/2005 | Gunner et al. |
| 2006/0204892 | A1 | 9/2006 | Mori et al. |
| 2007/0105044 | A1 | 5/2007 | Maeda et al. |
| 2007/0160930 | A1 | 7/2007 | Wang et al. |
| 2008/0160449 | A1 | 7/2008 | Kubo et al. |
| 2008/0161524 | A1 | 7/2008 | Yan et al. |
| 2008/0274304 | A1 | 11/2008 | Cherkaoui et al. |
| 2009/0130591 | A1 | 5/2009 | Yao et al. |
| 2009/0263588 | A1 | 10/2009 | Kakino |
| 2010/0151274 | A1 | 6/2010 | Kang et al. |
| 2010/0289019 | A1 | 11/2010 | Katz et al. |
| 2011/0159252 | A1 | 6/2011 | Ober et al. |
| 2012/0077126 | A1 | 3/2012 | Mori et al. |
| 2012/0114879 | A1 | 5/2012 | Hatanaka et al. |
| 2012/0121858 | A1 | 5/2012 | Kato |
| 2012/0135206 | A1 | 5/2012 | Haraguchi et al. |
| 2012/0301828 | A1 | 11/2012 | Tachibana et al. |
| 2012/0305897 | A1 | 12/2012 | Ober et al. |
| 2013/0108960 | A1 | 5/2013 | Hatakeyama et al. |
| 2013/0200345 | A1 | 8/2013 | Usta et al. |
| 2013/0302598 | A1 | 11/2013 | Haraguchi et al. |
| 2014/0127625 | A1 | 5/2014 | Defranco et al. |
| 2014/0205818 | A1 | 7/2014 | Schwartz et al. |
| 2014/0248565 | A1 | 9/2014 | Defranco et al. |
| 2014/0322656 | A1 | 10/2014 | Wright et al. |
| 2014/0342287 | A1 | 11/2014 | Wright et al. |
| 2014/0356788 | A1 | 12/2014 | Wright et al. |
| 2014/0356789 | A1 | 12/2014 | Wright et al. |
| 2015/0030981 | A1 * | 1/2015 | Robello .................. G03F 7/32 430/285.1 |
| 2015/0132699 | A1 | 5/2015 | Robello et al. |
| 2015/0140729 | A1 | 5/2015 | Ferro et al. |
| 2017/0219921 | A1 * | 8/2017 | O'Toole .............. H01L 51/0018 |

FOREIGN PATENT DOCUMENTS

| | | |
|---|---|---|
| EP | 2 089 442 B1 | 10/2014 |
| WO | 01/05578 A1 | 1/2001 |
| WO | 01/040359 A1 | 6/2001 |
| WO | 03/075093 A1 | 6/2008 |
| WO | 2008/071662 A1 | 6/2008 |
| WO | 2012/074064 A1 | 6/2012 |
| WO | 2012/074076 A1 | 6/2012 |
| WO | 2012/129162 A2 | 9/2012 |
| WO | 2012/148884 A2 | 11/2012 |
| WO | 2013/018986 A1 | 2/2013 |
| WO | 2013/039842 A1 | 3/2013 |
| WO | 2013/074622 A1 | 5/2013 |
| WO | 2015/013396 A1 | 1/2015 |
| WO | 2015/073534 A1 | 5/2015 |

OTHER PUBLICATIONS

International Search Report and Written Opinion of the International Searching Authority for corresponding International Patent Application No. PCT/US2014/065216 dated Feb. 25, 2015, 10 pgs.
Park, S. et al., "Inorganic/organic multilayer passivation incorporating alternating stacks of organic/inorganic multilaters for long-term air-stable organic light-emitting diodes", Organic Electronics, (2013), 14: 3385-3391.
Taylor, P. et al., "Orthogonal Patterning of PEDOT:PSS for Organic Electronics using Hydrofluoroether Solvents", Advanced Materials, (2009), 21: 2314-2317.
International Search Report and Written Opinion of the International Searching Authority for corresponding International Patent Application No. PCT/US2015/014425 dated May 18, 2015, 10 pgs.

* cited by examiner

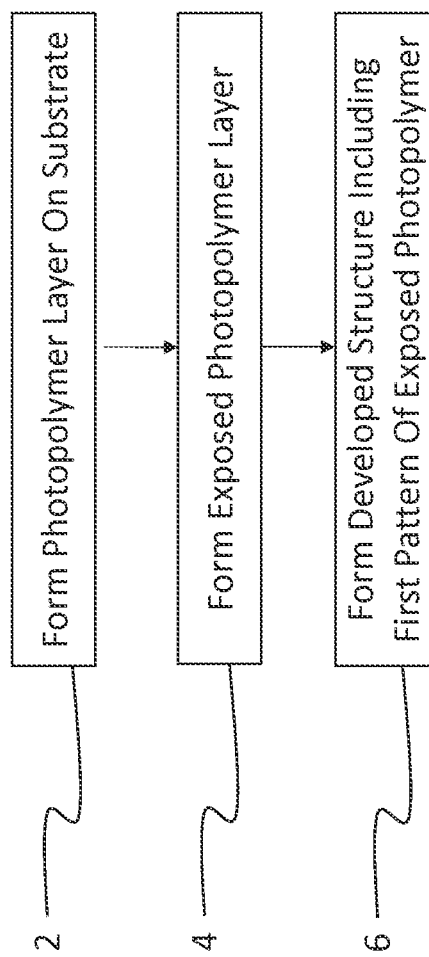

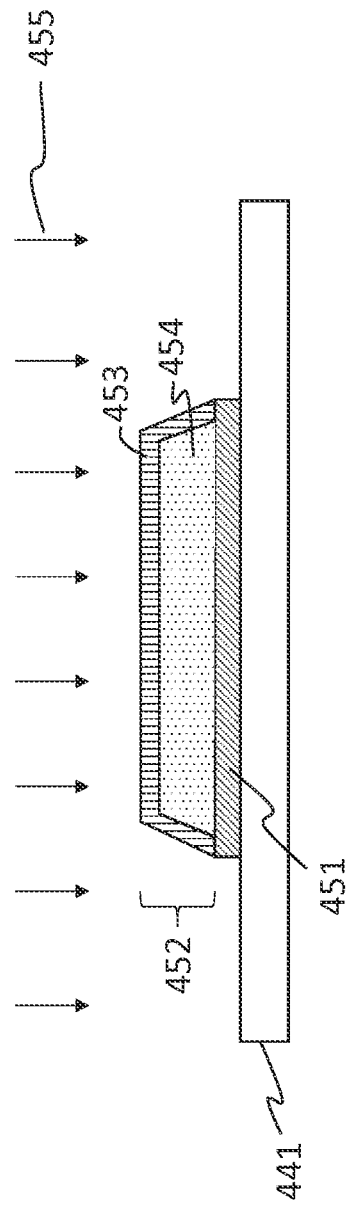
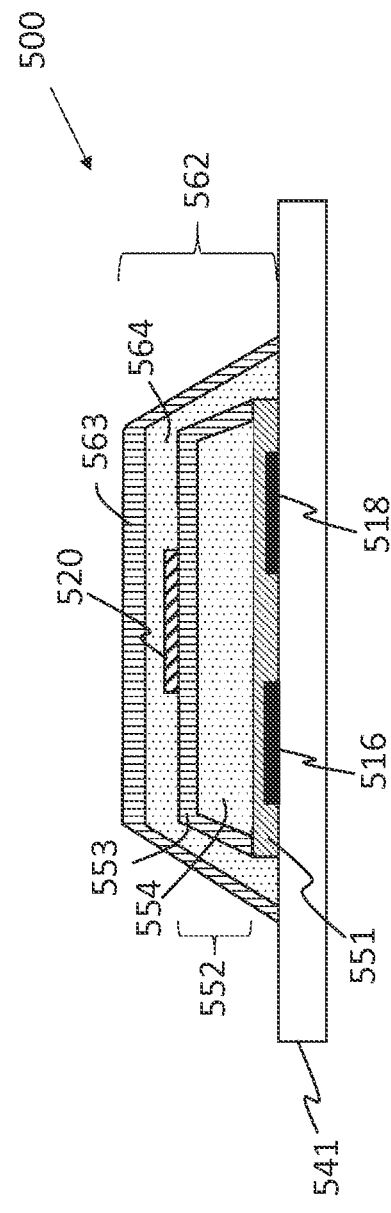

CROSS-LINKABLE FLUORINATED PHOTOPOLYMER

CROSS REFERENCE TO RELATED APPLICATIONS

This application is a continuation of U.S. patent application Ser. No. 15/924,829, filed on Mar. 19, 2018, which is a continuation of U.S. patent application Ser. No. 15/117,032, filed on Aug. 5, 2016, now U.S. Pat. No. 9,958,778, which is a National Stage Application of PCT/US2015/014425 filed on Feb. 4, 2015, which claims priority to U.S. Patent Application Ser. No. 61/937,122, filed on Feb. 7, 2014, and which applications are incorporated herein by reference. A claim of priority is made to each of the above disclosed applications.

BACKGROUND

The present invention relates to fluorinated photopolymers having a photo cross-linkable group. Such photopolymers are particularly useful in organic electronic and bioelectronic devices.

Photocurable polymeric compositions have many possible commercial applications. They can be used as dielectrics, insulators, encapsulants, inert overcoats, water or oil repellent layers, light blocking or emitting layers, paints, printing inks and the like. Certain photocurable polymeric compositions are of particular use in the fabrication of organic electronic devices, including bioelectronic devices.

Organic electronic devices may offer certain performance and price advantages relative to conventional inorganic-based devices. As such, there has been much commercial interest in the use of organic materials in electronic device fabrication. For example, organic materials such as conductive polymers can be used to manufacture devices that have reduced weight and drastically greater mechanical flexibility compared to conventional electronic devices based on metals and silicon. Further, devices based on organic materials are likely to be less damaging to the environment than devices made with inorganic materials, since organic materials do not require toxic metals and can ideally be fabricated using relatively benign solvents and methods of manufacture. Thus, in light of these superior weight and mechanical properties, and particularly in light of the lowered environmental impact in fabrication and additionally in disposal, electronic devices based on organic materials are expected to be less expensive than devices based on conventional inorganic materials.

One problem facing bioelectronic and organic electronic devices is that the materials and patterning processes used for conventional inorganic electronics are often not compatible with biological and organic electronic materials. Thus, new materials and processes are needed. For example, electronic devices usually require an insulating or dielectric layer (e.g., $SiO_2$ or spin-coated polymers). Typical insulating or dielectric materials and processing methods are often not compatible with sensitive bioelectronic and organic electronic material layers. Further, many organic electronic devices contain materials that are moisture or air sensitive and require special encapsulation methods or coatings.

US 2011/0159252 discloses a useful method for patterning organic electronic materials by an "orthogonal" process that uses fluorinated solvents and fluorinated photoresists. The fluorinated solvents have very low interaction with organic electronic materials. However, the disclosed fluorinated photoresists are generally not designed to form a permanent layer in a device, but rather, are removed.

In light of the above, there is a need to provide a more effective dielectric and barrier layer materials, structures and methods that are compatible in bioelectronic and organic electronic devices.

SUMMARY

In accordance with one aspect of the present disclosure, a photosensitive composition includes a fluorinated solvent and a fluorinated photo cross-linkable polymer including at least one repeating unit having a fluorine-containing cinnamate group, wherein the polymer has a total fluorine content in a weight range of 20 to 60%. In accordance with another aspect of the present disclosure, a photosensitive composition includes a fluorinated solvent and a fluorinated photo cross-linkable polymer including a first repeating unit having fluorine-containing group but not a cinnamate group, and a second repeating unit having a fluorine-containing cinnamate group, wherein the polymer has a total fluorine content in a weight range of 30 to 60%.

In accordance with another aspect of the present disclosure, a photosensitive composition includes a hydrofluoroether solvent and a fluorinated photo cross-linkable polymer including at least a first repeating unit having a fluorine-containing group and a second repeating unit having a cinnamate group; and a hydrofluoroether solvent.

In accordance with another aspect of the present disclosure, a method of processing a fluorinated photo cross-linkable polymer includes: forming a photopolymer layer on a substrate, the photopolymer layer including a photo cross-linkable polymer according to any of the photosensitive compositions of the present disclosure; exposing the photopolymer layer to patterned radiation to form an exposed photopolymer layer; and contacting the exposed photopolymer layer with a developing agent to remove a portion of the exposed photopolymer layer in accordance with the patterned light, thereby forming a developed structure having a first pattern of cross-linked polymer covering the substrate and a complementary second pattern of uncovered substrate corresponding to the removed portion of polymer, the developing agent including at least 50% by volume of a fluorinated developing solvent.

In accordance with another aspect of the present disclosure, a method of forming a dielectric structure includes: providing a first photopolymer layer over a substrate, the first photopolymer layer including a first photo cross-linkable polymer having at least a first repeating unit having a fluorine-containing group, a second repeating unit having a photo cross-linkable group and a third repeating having a dry-etch-resistant group including at least one dry-etch-resistant atom having an atomic weight of at least 24; exposing the first photopolymer layer to radiation to form a cross-linked first polymer; and subjecting the cross-linked first polymer to a dry etching gas to form a first dielectric structure having a surface region comprising a higher density of dry-etch-resistant atoms than an interior region.

In an embodiment, cross-linked thin films formed from compositions of the present disclosure have high resistance to water and organic solvents. In an embodiment, cross-linked thin films of the present disclosure form effective dielectric layers in electronic devices. In an embodiment, cross-linked films of the present disclosure are used to form multi-layer protective barriers over water- or oxygen-sensitive electronic devices. In certain embodiments, surface wettability of the cross-linked films or the coatability of subsequent layers may be tailored to specific needs by selecting the amount of polymer branching or fluorine content.

BRIEF DESCRIPTION OF DRAWINGS

FIG. 1 is a flow chart depicting the steps for forming a developed structure according to an embodiment of the present disclosure;

FIG. 4A through 4D illustrates a series of cross-sectional views at various stages of forming a dielectric structure according to an embodiment of the present disclosure; and FIG. 5 is a cross-sectional diagram of an OTFT device having first and second dielectric structures.

DETAILED DESCRIPTION

Figure 2A:
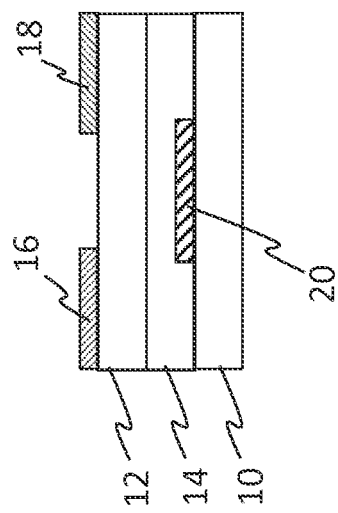
FIG. 2A is a cross-sectional view of a bottom gate/bottom contact organic thin film transistor according to an embodiment of the present disclosure.

It is to be understood that the attached drawings are for purposes of illustrating the concepts of the invention and may not be to scale.

A photosensitive composition (also referred to herein as a photopolymer composition) includes a light-sensitive material that can be coated or applied in some way to produce a photocurable film, e.g., a photo-patternable film. In a preferred embodiment, photopolymers of the present disclosure remain as part of a device and may be used to form various layers or structures as discussed more fully below. An embodiment of the present disclosure is directed to improved fluorinated photopolymers that are particularly suited for coating and developing using fluorinated solvents. The solvents for the fluorinated photopolymer solution and developing agent are each chosen to have low interaction with other material layers that are not intended to be dissolved or otherwise damaged. Such solvents are collectively termed "orthogonal" solvents. This can be tested by, for example, immersion of a device including the material layer of interest into the solvent prior to operation. The solvent is orthogonal if there is no problematic reduction in the functioning of the device.

Certain embodiments of the present disclosure are particularly suited to devices using solvent- or water-sensitive, active organic materials. Examples of active organic materials include, but are not limited to, organic electronic materials, such as organic semiconductors, organic conductors, OLED (organic light-emitting diode) materials and organic photovoltaic materials, organic optical materials and biological materials (including bioelectronic materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix.

The photopolymers of the present disclosure are provided in a coating solvent that typically includes at least 50% by volume of a fluorinated solvent, preferably at least 90% by volume. If a deposited layer is intended to be photo-patterned, a pattern-exposed photopolymer layer can be developed using a developing agent capable of discriminating between exposed and unexposed areas. In an embodiment, the developing agent includes at least 50% by volume of a fluorinated solvent, preferably at least 90% by volume. In an embodiment, a developed (patterned) photopolymer layer may optionally be stripped using a stripping agent capable of dissolving or lifting off the exposed photopolymer. In an embodiment, the stripping agent includes at least 50% by volume of a fluorinated solvent. Depending on the particular material set and solvation needs of the process, the fluorinated solvent may be selected from a broad range of materials such as chlorofluorocarbons (CFCs), hydrochlorofluorocarbons (HCFCs), hydrofluorocarbons (HFCs), perfluorocarbons (PFCs), hydrofluoroethers (HFEs), perfluoroethers, perfluoroamines, trifluoromethyl-substituted aromatic solvents, fluoroketones and the like.

Particularly useful fluorinated solvents include those that are perfluorinated or highly fluorinated liquids at room temperature, which are immiscible with water. Among those solvents, hydrofluoroethers (HFEs) are known to be highly environmentally friendly, "green" solvents. HFEs, including segregated HFEs, are preferred solvents because they are non-flammable, have zero ozone-depletion potential, lower global warming potential than PFCs and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1, 1,1,2,3, 4,4,5,5,6,6,6-dodecafluoro-2-trifluoromethyl-hexane (HFE-7500 aka Novec™ 7500), 1,1,1,2,3,3-hexafluoro-4-(1,1,2,3, 3,3,-hexafluoropropoxy)-pentane (HFE-7600 aka PF7600 (from 3M)), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,2-(1,1,2,2-tetrafluoroethoxy)ethane (HFE-578E), 1,1,2,2-tetrafluoroethyl-1H,1H,5H-octafluoropentyl ether (HFE-6512), 1,1,2, 2-tetrafluoroethyl-2,2,2-trifluoroethyl ether (HFE-347E), 1,1,2,2-tetrafluoroethyl-2,2,3,3-tetrafluoropropyl ether (HFE-458E), 2,3,3,4, 4-pentafluorotetrahydro-5-methoxy-2, 5-bis[1,2,2,2-tetrafluoro-1-(trifluoromethyl)ethyl]-furan (HFE-7700 aka Novec™ 7700) and 1,1,1,2,2,3,3,4,4,5,5,6, 6-tridecafluorooctane-propyl ether (TE6O-C3).

Coatable, fluorinated photopolymer compositions useful in the present disclosure include a fluorinated solvent and a fluorinated photopolymer (homopolymer or copolymer) material having photo cross-linkable repeating units, and optionally, other repeating units having other functional groups such as photosensitizing groups, light-absorbing groups, etch-resistant groups, solubility or rheology-modifying groups, adhesion-promoting groups, dielectric-modifying groups, Tg-modifying groups, branching agents and the like. The terms polymer and copolymer in the present disclosure includes oligomers in addition to higher MW polymers. A copolymer is suitably a random copolymer, but other copolymer types can be used, e.g., block copolymers, alternating copolymers, periodic copolymers and branched copolymers. The term "repeating unit" is used broadly herein and simply means that there is more than one unit per polymer chain. The term is not intended to convey that there is necessarily any particular order or structure with respect to the other repeating units unless specified otherwise.

Preferred fluorinated photopolymers of the present disclosure generally have a total fluorine content in a weight range of about 15 to 60%. In an embodiment, the fluorinated photopolymer is soluble in at least one hydrofluoroether solvent to at least 1% by weight, preferably to at least 5% by weight, and more preferably to at least 10% by weight. In an embodiment, the fluorinated photopolymer composition solvent(s) are comprised of at least 50% by volume of a hydrofluoroether solvent having a boiling point in a range of 100° C. to 175° C., or preferably 100° C. to 150° C., as such solvents often provide improved coatings relative to solvents outside of this range. The photosensitive composition may optionally include various additives such as sensitizing dyes, stabilizers, coating aids, and the like, so long as they have sufficient solubility or dispersability in fluorinated solvents, particularly hydrofluoroethers, to maintain desired functionality.

When the fluorinated photopolymer composition (e.g., as a dried layer provided on a substrate) is exposed to radiation such as UV or visible light, the photo cross-linkable group cross-links with another photo cross-linkable group, e.g., on another chain of fluorinated photopolymer. This significantly reduces its solubility relative to the unexposed regions thereby allowing development of an image with the appropriate solvent (typically fluorinated). In an embodiment, the reduced solubility of radiation-exposed photopolymer can be used to form a permanent layer or structure in a device.

Photopolymers of the present disclosure may be formed by many possible methods known in the art. For example, photo cross-linkable repeating units (and other repeating units if desired) may be formed via a post-polymerization reaction. In such method, an intermediate polymer (a precursor to the desired photopolymer) is first prepared, said intermediate polymer comprising suitably reactive functional groups for forming one of more of the desired repeating units. For example, an intermediate polymer containing pendant carboxylic acid moieties can be reacted with a target compound bearing an alcohol group in an esterification reaction to produce the desired repeating unit. In another example, a polymer containing a suitable leaving group such as primary halide can be reacted with a target compound bearing a phenol moiety to form a repeat unit via an etherification reaction. In addition to simple condensation reactions such as esterification and amidation, and simple displacement reactions such as etherification, a variety of other covalent-bond forming reactions well-known to practitioners skilled in the art of organic synthesis can be used to form any of the specified repeat units. Examples include palladium-catalyzed coupling reactions, "click" reactions, addition to multiple bond reactions, Wittig reactions, reactions of acid halides with suitable nucleophiles, and the like.

Alternatively, the repeating units of the photopolymer are formed directly by polymerization of one or more appropriate monomers, rather than by attachment to an intermediate polymer. That is, monomers having a polymerizable group and the desired repeating unit are polymerized. Some non-limiting examples of useful polymerizable groups include acrylates (e.g. acrylate, methacrylate, cyanoacrylate and the like), acrylamides, vinylenes (e.g., styrenes), vinyl ethers and vinyl esters Although many of the embodiments below refer to polymerizable monomers, analogous structures and ranges are contemplated and within the scope of the present disclosure, wherein one or more of the repeating units are instead formed by attachment of the relevant group to an intermediate polymer as described above.

In an embodiment, a photosensitive composition includes a photo cross-linkable polymer comprising at least a repeating unit having a fluorine-containing cinnamate group, wherein the polymer has a total fluorine content in a weight range of 20 to 60%, preferably 30 to 55%, and further comprises a fluorinated solvent, preferably a hydrofluoroether. The photo cross-linkable polymer of this embodiment may comprise a repeating unit having a fluorine-containing cinnamate group as shown in formula (1):

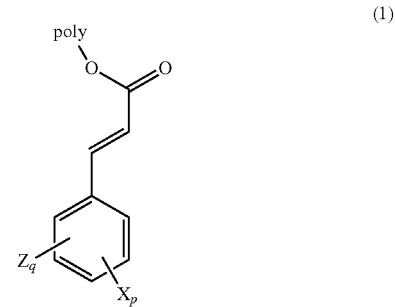

(1)

wherein p is an integer from 1 to 5, X is an independently selected fluorine-containing alkyl, alkoxy, alkylthio, aryl, aryloxy, alkanoate, benzoate, alkyl ester, aryl ester, or alkanone; q is an integer from 0 to 4 such that $q+p \leq 5$, Z is an independently selected alkyl, alkoxy, alkylthio, aryl, aryloxy, alkanoate, benzoate, alkyl ester, aryl ester, or alkanone; and "poly" represents a polymer chain including any optional linking groups between the fluorinated cinnamate group and the polymer chain. Throughout this disclosure, unless otherwise specified, any use of the term alkyl includes straight-chain, branched and cyclo alkyls. In certain embodiments, the weight percentage of the structure according to formula (1), not including "poly", accounts for at least 25% of the total polymer weight. The fluorine-containing cinnamate group may optionally be the only repeating unit of the photo cross-linkable polymer, but alternatively, additional repeating units bearing other functional groups (mentioned above) may optionally be included along with the fluorine-containing cinnamate. In an embodiment, the additional repeating unit includes an alkyl-containing group. In certain embodiments, the mole percentage of repeating unit comprising the fluorinated cinnamate group relative to all repeating units is in a range of 25 to 100%.

Some non-limiting examples of polymerizable monomers in accordance with formula (1) are shown below.

(C-1)
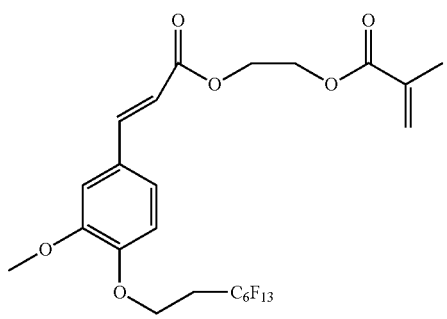

(C-2)
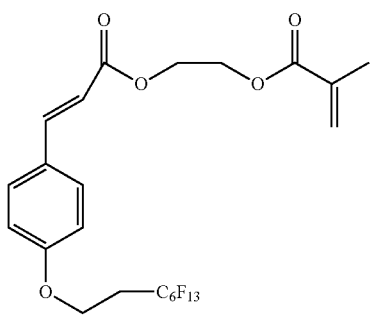

(C-3)
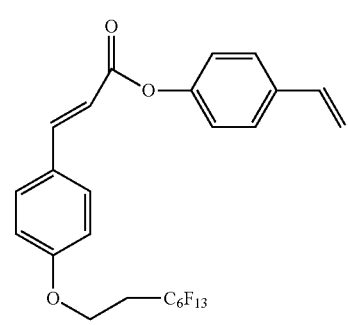

(C-4)
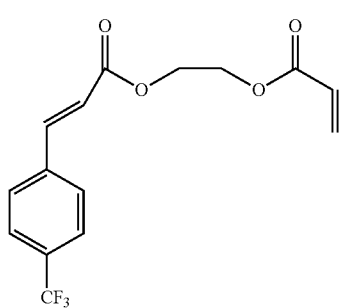

(C-5)
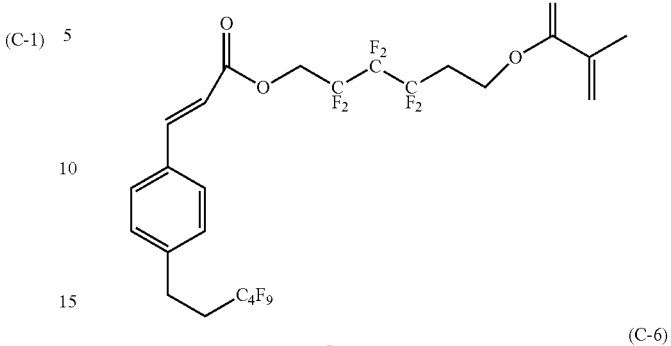

(C-6)
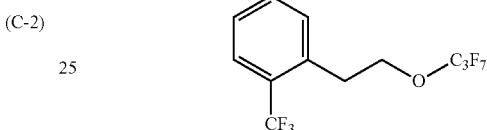

(C-7)
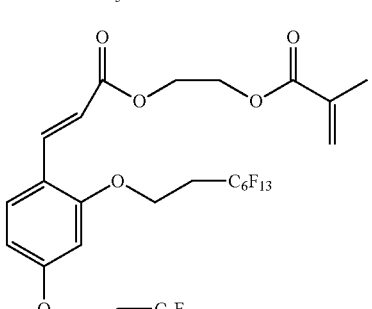

In an embodiment, a photosensitive composition includes a fluorinated photo cross-linkable polymer comprising a first repeating unit having a fluorine-containing group but not a cinnamate group, and a second repeating unit having a fluorine-containing cinnamate group, wherein the polymer has a total fluorine content in a weight range of 30 to 60%, preferably 35 to 55%, and further comprises a fluorinated solvent, preferably a hydrofluoroether. For example, the photo cross-linkable polymer of this embodiment may comprise a repeating unit having a fluorine-containing cinnamate group as shown in formula (1) above. In this embodiment, the mole ratio of the first repeating unit to the second repeating unit is typically in a range of 0.1 to 10, or alternatively, 0.25 to 4.

The first repeating unit having the fluorine-containing group but not a cinnamate group is preferably a fluorine-containing alkyl, alkoxy, alkylthio, aryl, aryloxy, alkanoate, benzoate, alkyl ester, aryl ester, or alkanone. In an embodiment, the fluorine-containing group is a hydrofluorocarbon or hydrofluoroether having at least as many fluorine atoms as carbon atoms. In an embodiment, the fluorine-containing group is a perfluorinated alkyl or a partially fluorinated alkyl group having at least 4 carbon atoms, including but not limited to 1H,1H,2H,2H-perfluoroalkyls such as 1H,1H,2H,2H-perfluorooctyl (i.e., 2-perfluorohexyl ethyl).

In an embodiment, the fluorinated photopolymer material includes a copolymer comprising at least two distinct repeating units, including a first repeating unit having a fluorine-containing group, and a second repeating unit having a photo cross-linkable group. In certain alternative embodiments, the cross-linkable group may be acid- or base-catalyzed, or directly photo cross-linkable. Acid catalyzed cross-linkable groups are discussed in more detail below. In an embodiment, the photo cross-linkable group is directly cross-linkable without the need for acid or base catalysis. Directly photo cross-linkable groups work by forming a photo excited state (either by direct absorption of light or by energy transfer from a sensitizing dye) that cross-links with another cross-linkable group, e.g., on another chain of polymer. There are many directly photo cross-linkable groups known in the art. In an embodiment, the directly photo cross-linkable group comprises a cross-linkable carbon-carbon double bond.

In an embodiment, a photosensitive composition includes a photo cross-linkable polymer comprising at least a first repeating unit having fluorine-containing group and a second repeating unit having a cinnamate group, and a hydrofluoroether solvent. In an embodiment, the polymer has a total fluorine content in a weight range of 15 to 55%, preferably 20 to 50%, or more preferably 25 to 45%. The first repeating unit includes those described previously with respect to a first repeating unit having a fluorine-containing group but not a cinnamate group.

In a preferred embodiment, the photo cross-linkable group comprises a cinnamate, e.g., as shown in formula (2):

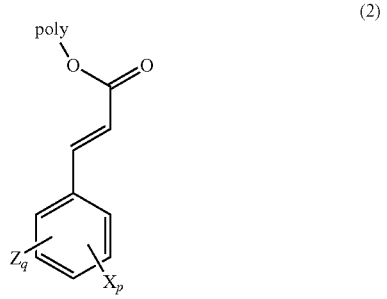

(2)

wherein p is an integer from 0 to 5, X is an independently selected fluorine-containing alkyl, alkoxy, alkylthio, aryl, aryloxy, alkanoate, benzoate, alkyl ester, aryl ester, or alkanone; q is an integer from 0 to 5 such that q+p≤5, Z is an independently selected alkyl, alkoxy, alkylthio, aryl, aryloxy, alkanoate, benzoate, alkyl ester, aryl ester, or alkanone; and "poly" represents a polymer chain including any optional linking groups between the cinnamate group and the polymer chain. Some non-limiting examples of polymerizable monomers in accordance with formula (2) include the materials shown above with respect to formula (1), C-1 through C-6, and those shown below.

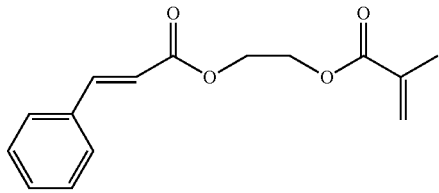

(C-8)

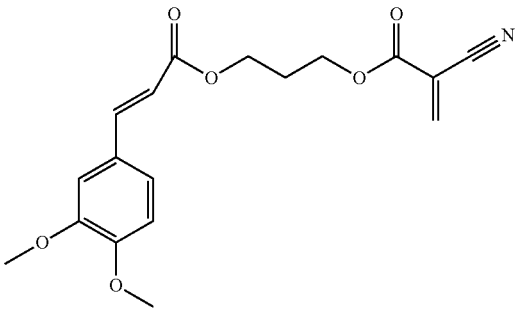

(C-9)

In an embodiment, p and q are both 0. In another embodiment, q is 0, p is at least 1 and X is a fluorine-containing alkyl or alkoxy. In another embodiment, q and p are both at least 1, X is a fluorine-containing alkyl or alkoxy, and Z is a non-fluorine-containing alkyl or alkoxy. In an embodiment, when at least one or both of q and p is at least 1, the photopolymer composition does not include a sensitizing dye. In an embodiment, when q and p are both 0, the photopolymer composition includes a sensitizing dye.

In an embodiment, the mole ratio of the first repeating unit to the second repeating unit is in a range of 0.1 to 10, or alternatively, in a range of 0.25 to 4.

In an embodiment, the fluorinated photopolymer material includes a copolymer formed at least from a first monomer having a fluorine-containing group and a second monomer having a photo cross-linkable group. Additional monomers may optionally be incorporated into the copolymer. The first monomer is one capable of being copolymerized with the second monomer and has at least one fluorine-containing group.

In an embodiment, the fluorine-containing group of the first monomer is an alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the fluorinated photopolymer. In an embodiment, the first monomer does not contain protic or charged substituents, such as hydroxy, carboxylic acid, sulfonic acid or the like. In a preferred embodiment, the first monomer has a structure according to formula (3):

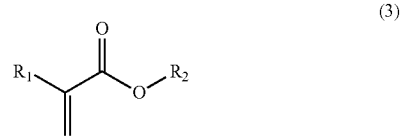

(3)

In formula (3), $R_1$ represents a hydrogen atom, a cyano group, a methyl group or an ethyl group. $R_2$ represents a fluorine-containing group, in particular, a substituted or unsubstituted alkyl group having at least 1 fluorine atom, preferably at least 3 fluorine atoms and more preferably at least 5 fluorine atoms. In an embodiment, the alkyl group is a hydrofluorocarbon or hydrofluoroether having at least as many fluorine atoms as carbon atoms. In an embodiment $R_2$ represents a perfluorinated alkyl or a partially fluorinated alkyl group having at least 4 carbon atoms, including but not limited to 1H,1H,2H,2H-perfluorinated alkyl having at least 4 carbon atoms. An example of the latter would be 1H,1H, 2H,2H-perfluorooctyl (i.e., 2-perfluorohexyl ethyl), and a particularly useful first monomer includes 1H,1H,2H,2H-perfluorooctyl methacrylate ("FOMA") and similar materials.

In an embodiment, the photo cross-linkable group of a copolymer is an acid-catalyzed cross-linkable group. Activation of the acid-catalyzed cross-linkable group typically requires that a photo-acid generator (PAG) be added to the fluorinated photopolymer composition, e.g., as a small molecule additive. If there is no additional sensitizing dye, the PAG absorbs radiation such as UV or visible light to initiate an acid-forming decomposition reaction. In some embodiments, the composition includes a sensitizing dye, either added to the solution or incorporated into the polymer. In this case, the sensitizing dye absorbs radiation and forms an excited state capable of reacting with a PAG to generate an acid. The acid catalyzes the cross-linking of the acid-catalyzed cross-linkable groups, e.g., between two polymer chains. In some cases the radiation-exposed photopolymer may need to be heated for a short time to catalyze cross-linking. Chemically amplified systems such as this can be desirable in certain embodiments since they enable the exposing step to be performed through the application of relatively low energy UV light exposure (typically under 100 mJ/cm$^2$). This is advantageous since some active organic materials useful in applications to which the present disclosure pertains may partially decompose in the presence of intense UV light. Also, decreased light exposure may be obtained by shorter exposure duration, improving the manufacturing throughput of the desired devices.

Examples of acid-catalyzed cross-linkable groups include, but are not limited to, cyclic ether groups and vinyloxy groups. In an embodiment, the cyclic ether is an epoxide or an oxetane. Some non-limiting examples of some acid-catalyzed cross-linkable groups include the following wherein (*) refers to an attachment site to the photopolymer or polymerizable group:

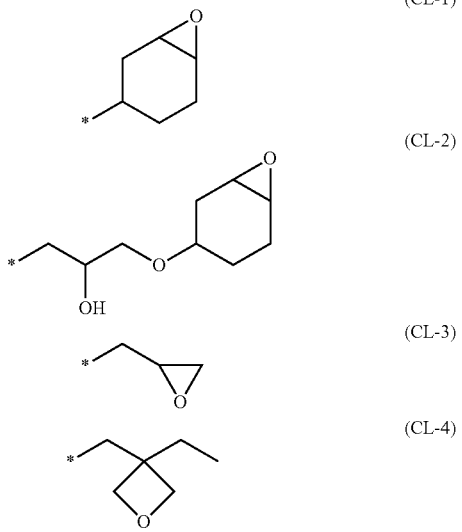

(CL-1)

(CL-2)

(CL-3)

(CL-4)

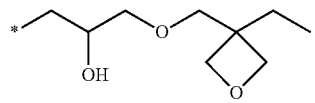

(CL-5)

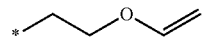

(CL-6)

Many useful PAG compounds exist that may be added to a photopolymer composition. The PAG preferably has at least some solubility in the coating solvent. The amount of PAG required depends upon the particular system, but generally, will be in a range of 0.1 to 6% by weight relative to the photopolymer. In some embodiments, the presence of a sensitizing dye in the composition may substantially reduce the amount of PAG required. In an embodiment, the amount of PAG is in a range of 0.1 to 2% relative to the photopolymer. Fluorinated PAGs are generally preferred and non-ionic PAGs are particularly useful. Some useful examples of PAG compounds include 2-[2,2,3,3,4,4,5,5-octafluoro-1-(nonafluorobutylsulfonyloxyimino)-pentyl]-fluorene (ONPF) and 2-[2,2,3,3,4,4,4-heptafluoro-1-(nonafluorobutylsulfonyloxyimino)-butyl]-fluorene (HNBF). Other non-ionic PAGS include: norbornene-based non-ionic PAGs such as N-hydroxy-5-norbornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate.

Some additional classes of PAGs include: triarylsulfonium perfluoroalkanesulfonates, such as triphenylsulfonium perfluorooctanesulfonate, triphenylsulfonium perfluorobutanesulfonate and triphenylsulfonium trifluoromethanesulfonate; triarylsulfonium hexafluorophosphates (or hexafluoroantimonates), such as triphenylsulfonium hexafluorophosphate and triphenylsulfonium hexafluoroantimonate; triaryliodonium perfluoroalkanesulfonates, such as diphenyliodonium perfluorooctanesulfonate, diphenyliodonium perfluorobutanesulfonate, diphenyliodonium trifluoromethanesulfonate, di-(4-tert-butyl)phenyliodonium, perfluorooctanesulfonate, di-(4-tert-butyl)phenyliodonium perfluorobutanesulfonate, and di-(4-tert-butyl)phenyliodonium trifluoromethanesulfonate; and triaryliodonium hexafluorophosphates (or hexafluoroantimonates) such as diphenyliodonium hexafluorophosphate, diphenyliodonium hexafluoroantimonate, di-(4-tert-butyl)phenyliodonium hexafluorophosphate, and di-(4-tert-butyl)phenyliodonium hexafluoroantimonate. Suitable PAGs are not limited to those specifically mentioned above. Combinations of two or more PAGs may be used as well.

It is common in photolithography to etch patterns into layers using a "dry etchant" with the patterned photopolymer acting as an etch barrier. Herein, the term "dry etchant" is used broadly and refers to any useful gaseous material possessing energy sufficient to etch (remove) a target material. Dry etching includes, but is not limited to, glow discharge methods (e.g., sputter etching and reactive ion etching), ion beam etching (e.g., ion milling, reactive ion beam etching, ion beam assisted chemical etching) and other "beam" methods (e.g., ECR etching and downstream etching), all of which are methods known in the art. Some common dry etchants include oxygen plasma, argon plasma, UV/ozone, $CF_4$ and $SF_6$, and various combinations.

It can be advantageous, therefore, for the photopolymer to have reasonable resistance to the dry etch to ensure good pattern transfer to the underlying layer. The fluorinated photopolymer may optionally comprise a repeating unit having a dry-etch-resistant group. Polycyclic organic groups are sometimes used to improve dry-etch resistance. Alternatively, or in addition, the dry-etch-resistant group includes at least one dry-etch-resistant atom having an atomic weight of at least 24. In an embodiment, the dry-etch-resistant atom is Si, Ti, Ge, Al, Zr, or Sn. The dry-etch-resistant group may optionally be formed from a polymerizable monomer, e.g., one that has an organosilane, a siloxane, silazane or metal-loxane group. In a preferred embodiment, the dry-etch-resistant group includes a silane or siloxane group. In certain embodiments, when a fluorinated photopolymer layer is subjected to an etching gas comprising oxygen radicals, the dry-etch-resistant group will break down to form a layer of oxide, e.g., silicon oxide (SiOx) or other metal oxide. This layer of oxide reduces the etch rate of the remaining underlying polymer and can be used to form a dielectric structure having a surface region comprising a higher density of dry-etch-resistant atoms than an interior region.

Some non-limiting examples of polymerizable monomers having a dry-etch-resistant group include those that have a structure according to formula (3):

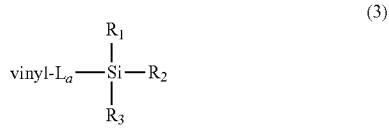

(3)

In formula (3), $R_1$ through $R_3$ are independently selected alkyl, aryl, alkoxy, aryloxy, siloxy groups, a=0 or 1, L is an optional linking group connecting a polymerizable vinyl moiety to the Si atom. The vinyl moiety may be have additional substitution so long as it is still readily polymerizable, e.g., alkyl, fluoro or cyano groups, or it may be part of a ring structure, e.g., as in norbornene or adamantane. A few non-limiting examples of such structures include:

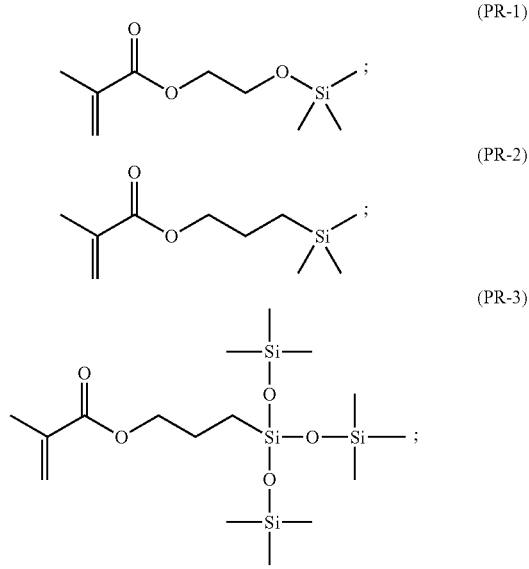

(PR-1)

(PR-2)

(PR-3)

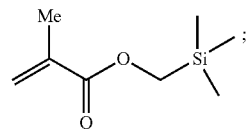

(PR-4)

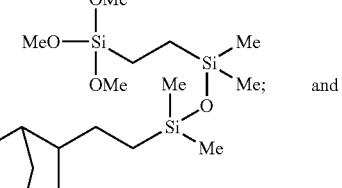

(PR-5)

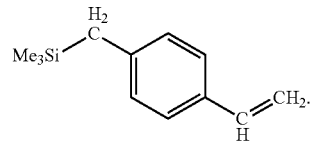

(PR-6)

In an embodiment, the dry-etch-resistant group is provided as part of a third repeating unit in a fluorinated photopolymer also comprising a first repeating unit having a fluorine-containing group and a second repeating unit having a photo cross-linkable group. In an embodiment, the mole ratio of the third repeating unit relative to the combined first and second repeating units is in a range of 0.1 to 1.

In an embodiment, the fluorinated photopolymer of the present disclosure includes sensitizing dye (in solution or attached to the polymer) that has a light absorption peak in a range of 300 to 450 nm as measured in a deposited film or in a fluorinated solvent solution. Although other wavelengths can be used, this range is compatible with many of the photolithographic, mercury lamp exposure units available in the industry that use i-line, h-line or g-line exposures.

Some non-limiting examples of potentially useful sensitizing dyes for cinnamate cross-linking groups include diaryl ketones (e.g., benzophenones), arylalkyl ketones (e.g., acetophenones), diaryl butadienes, diaryl diketones (e.g. benzils), xanthones, thioxanthones, naphthalenes, anthracenes, benzanthrone, phenanthrenes, chrysene, anthrones, 5-nitroacenapthene, 4-nitroaniline, 3-nitrofluorene, 4-nitromethylaniline, 4-nitrobiphenyl, picramide, 4-nitro-2,6-dichlorodimethylaniline, Michler's ketone, N-acyl-4-nitro-1-naphthylamine.

Preparation and polymerization of the monomers discussed above can generally be achieved using standard synthetic methods known to a skilled artisan. Some useful examples of the preparation of orthogonal photopolymers can be found in US Publication No. 2011/0159252, PCT publication WO2012148884, and co-pending U.S. application Ser. Nos. 14/291,692, 14/291,767, 14/335,406 and 14/539,574, the entire contents of which are incorporated herein by reference. Examples of the preparation of polymers incorporating acid-catalyzed cross-linkable groups can be found in US Publication Nos. 2009/0263588, 2009/0130591, and 2002/0161068, the entire contents of which are incorporated by reference. Examples of fluorinated copolymers comprising cinnamates can be found in U.S. Pat. No. 4,529,783.

A fluorinated photosensitive composition of the present disclosure may be applied to a substrate using any method suitable for depositing a photosensitive liquid material. For example, the composition may be applied by spin coating, curtain coating, bead coating, bar coating, spray coating, dip coating, gravure coating, ink jet, flexography or the like. The composition may be applied to form a uniform film or a patterned layer of unexposed photopolymer. Alternatively, the photopolymer can be applied to the substrate by transferring a preformed fluorinate photopolymer layer (optionally patterned) from a carrier sheet, for example, by lamination transfer using heat, pressure or both. In such an embodiment, the substrate or the preformed photopolymer layer may optionally have coated thereon an adhesion promoting layer.

A flow diagram for a photopatterning embodiment of the present disclosure is shown in FIG. 1, and includes the step 2 of forming a photopolymer layer on a substrate. The substrate may optionally be a multilayer structure having a rigid or flexible support (e.g., glass or plastic) and one or more additional patterned or non-patterned layers (e.g., made from dielectric materials, conductors, semiconductors, optically active materials and the like). In an embodiment, the top of the substrate includes a layer of active organic material that is in direct contact with the photopolymer layer.

In step 4 the photopolymer layer is exposed to patterned radiation within the spectral sensitivity range of the photopolymer (e.g., light in a range of 300 nm to 450 nm), thereby forming an exposed photopolymer layer having both exposed and unexposed portions. The patterned radiation forms areas of differential developability due to some chemical or physical change caused by the radiation exposure. In the present disclosure, radiation causes cross-linkable groups to react and cross link. Such cross linking generally reduces solubility in typical developer solutions, thus, the photopolymer layer is generally a negative tone material. Patterned radiation can be produced by many methods, for example, by directing exposing light through a photomask and onto the photopolymer layer. Photomasks are widely used in photolithography and often include a patterned layer of chrome that blocks light. The photomask may be in direct contact or in proximity. When using a proximity exposure, it is preferred that the light has a high degree of collimation. Alternatively, the patterned light can be produced by a projection exposure device. In addition, the patterned light can be from a laser source that is selectively directed to certain portions of the photopolymer layer.

In step 6, a developed structure is formed that includes a first pattern of exposed photopolymer. This can be done by contacting the exposed photopolymer layer to a developing agent. In an embodiment, the developing agent includes at least 50% by volume of a fluorinated solvent, e.g., a hydrofluoroether (HFE) solvent. During development, the portions of unexposed photopolymer are removed, thus forming a developed structure having a first pattern of exposed photopolymer that covers the substrate and a complementary second pattern of uncovered substrate corresponding to the removed portion of photopolymer. By "uncovered substrate", it is meant that the surface of the substrate is substantially exposed or revealed to a degree that it can be subjected to further treatments. Contacting the exposed photopolymer layer can be accomplished by immersion into the developing agent or by coating it with the developing agent in some way, e.g., by spin coating or spray coating. The contacting can be performed multiple times if necessary. The developed structure may optionally be subjected to further steps, depending on the nature of the device. For example, the structure may be treated in some way to modify a property of the uncovered substrate or exposed photopolymer, coated with an additional material layer, or treated with a wet or dry etch to remove a portion of the uncovered substrate.

Figure 2B:
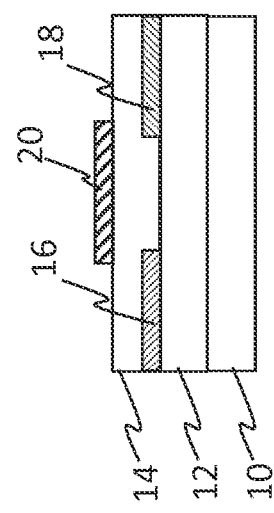
FIG. 2B is a cross-sectional view of a bottom gate/top contact organic thin film transistor according to an embodiment of the present disclosure.
Figure 2C:
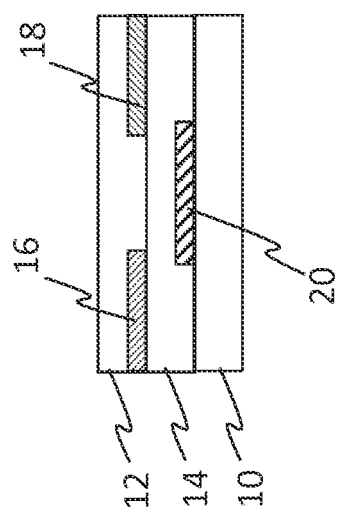
FIG. 2C is a cross-sectional view of a top gate/bottom contact organic thin film transistor according to an embodiment of the present disclosure.
Figure 2D:
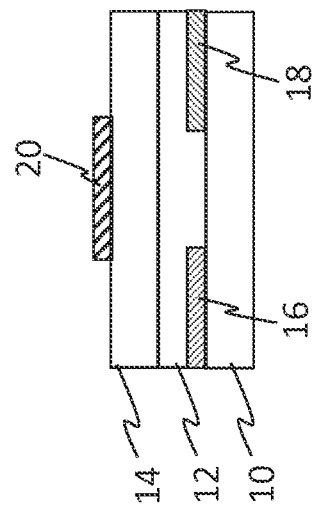
FIG. 2D is a cross-sectional view of a top gate/top contact organic thin film transistor according to an embodiment of the present disclosure.

In an embodiment, the fluorinated photopolymer of the present disclosure is used as a gate dielectric material in a thin film transistor (TFT), preferably an organic thin film transistor (OTFT). General materials and methods for making and operating OTFT devices are known to the skilled artisan, and some non-limiting examples can be found in U.S. Pat. Nos. 7,029,945, 8,404,844, 8,334,456, 8,411,489 and 7,858,970, the entire contents of which are incorporated by reference. FIGS. 2A-2D illustrate a few of the numerous possible embodiments, but in general, an OTFT is formed on a substrate 10 and has an organic semiconductor material layer 12, a gate dielectric material layer 14, a source electrode 16, a drain electrode 18 and a gate electrode 20. FIG. 2A shows a bottom gate/bottom contact OTFT, FIG. 2B shows a bottom gate/top contact OTFT, FIG. 2C shows a top gate/bottom contact OTFT, and FIG. 2D shows a top gate/top contact OTFT. In a preferred embodiment, the photopolymer is used as a dielectric in a top gate OTFT device. When used in displays, an array of OTFTs is typically provided in order to individually address each display pixel or sub-pixel. Although not shown in FIGS. 2A-2D, gate dielectric material layer 14 may be photopatterned as needed, for example, to provide open areas for making electrical contacts or building via structures. In addition, although not shown in FIGS. 2A-2D, the organic semiconductor material layer may be patterned so that each OTFT or display pixel/sub-pixel has its own discrete and separate organic semiconductor material.

The fluorinated photopolymer of the present disclosure may be used as an electrically insulating layer in an electronic device. For example, it may act as an insulating layer in a wire, a TFT structure (besides or in addition to acting as a gate dielectric), a touch screen, an RFID device, a sensor, a capacitor, a photovoltaic device, bioelectronic device and the like.

The present fluorinated photopolymer may be used as a partition structure that separates light-emitting areas of a display or lighting device, e.g., as described in U.S. Pat. No. 6,693,296 or in U.S. Pat. No. 5,701,055, the entire contents of both patents are incorporated by reference herein. Some examples of useful light-emitting materials include organic light-emitting materials, such as those used in OLED devices, and semiconductor nanoparticles, such as quantum dots formed from colloidal semiconductor nanocrystals, particularly IIIN or II/VI semiconductors.

The present fluorinated photopolymer may be patterned to form a plurality of wells that may be used for many possible purposes, e.g., wells that are capable of containing a display material. For example, the fluorinated photopolymer may form banks and wells as described in US 2005/0196969, the entire contents of which are incorporated by reference, wherein the wells are filled with a solution-based organic light emitting material. Such filling can optionally be by ink jet. Alternative display materials that may be added include liquid crystal material, electrophoretic material, a semiconductor nanoparticle material, a color filter material, and the like.

The present fluorinated photopolymer may be used to form at least a portion of a barrier layer in a water- or solvent-sensitive device. Organic semiconductors and organic light-emitting materials in particular are often very sensitive to water. A barrier layer can be coated over a device as a single layer or as multiple layers and may optionally be part of an alternating photopolymer/inorganic oxide multilayer barrier structure. In an embodiment, the water vapor transmission rate through a barrier layer comprising the present fluorinated photopolymer is less than $10^{-5}$ g/m$^2$/day, preferably less than $10^{-6}$ g/m$^2$/day, under ambient temperature and humidity conditions. In an embodiment, the water vapor transmission rate through a barrier comprising the present fluorinated photopolymer is less than $10^{-2}$ g/m$^2$/day, preferably less than $10^{-3}$ g/m$^2$/day, in an accelerated test at 60° C./90% RH (relative humidity). Tests for measuring water vapor transmission rates are known in the art, an example of which can be found in Organic Electronics 14 (2013) 3385-3391.

Figure 3:
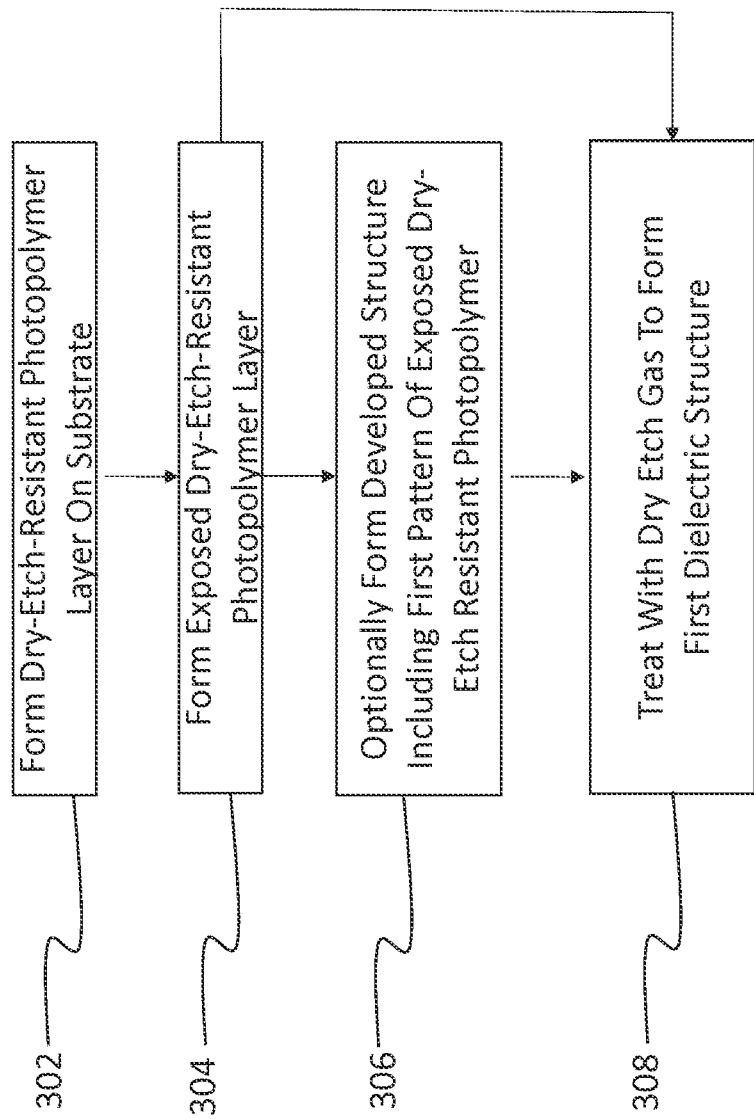
FIG. 3 is a flow chart depicting the steps for forming a dielectric structure according to an embodiment of the present disclosure.

A flow diagram for forming a dielectric structure according to an embodiment of the present disclosure is shown in FIG. 3, and includes the step 302 of forming a dry-etch-resistant photopolymer layer on a substrate. In an embodiment, the dry-etch-resistant photopolymer is a fluorinated photopolymer composition that includes a first repeating unit having a fluorine-containing group, a second repeating unit having a photo cross-linkable group and a third repeating having a dry-etch-resistant group containing one or more dry-etch-resistant atoms, as discussed previously.

In step 304 the dry-etch-resistant photopolymer layer is exposed to radiation within the spectral sensitivity range of the photopolymer (e.g., light in a range of 300 nm to 450 nm), thereby forming an exposed dry-etch-resistant photopolymer layer. In an embodiment, the exposure is a blanket exposure and all areas are exposed. In an alternative embodiment, the radiation is patterned thereby forming an exposed dry-etch-resistant photopolymer layer having both exposed and unexposed portions. Methods for providing patterned radiation are discussed above.

In the case where radiation from step 304 is patterned, a developed structure is formed in step 306 that includes a first pattern of exposed dry-etch-resistant photopolymer. This can be done by contacting the exposed dry-etch-resistant photopolymer layer to a developing agent in a manner previously discussed with respect to step 6. During development, the portions of unexposed photopolymer are removed, thus forming a developed structure having a first pattern of exposed dry-etch-resistant photopolymer that covers the substrate and a complementary second pattern of uncovered substrate corresponding to the removed portion of photopolymer.

In Step 308, the exposed dry-etch-resistant photopolymer or the developed structure is treated with a dry etching gas to form a first dielectric structure having a surface region comprising a higher density of dry-etch-resistant atoms than an interior region of the polymer. In an embodiment, the interior region also has a higher density of fluorine atoms than the surface region. In an embodiment, the dry-etch-resistant atom is Si and the dry etch is oxygen-based, thereby forming a surface region that is higher in silicon as silicon oxide relative to an interior region closer to the substrate, and an interior region that is has higher density of fluorination than the surface region. If the dry etching gas is treating a developed structure, the step may be used to pattern etch a portion of the uncovered substrate, e.g., a layer of an active organic material, in addition to forming a first dielectric structure.

Figure 4A:
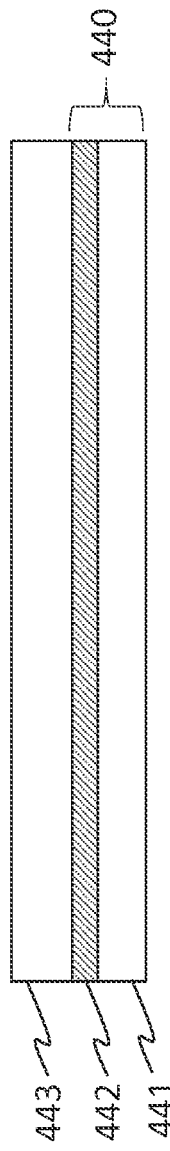

The embodiment of FIG. 3 is illustrated in FIGS. 4A-4D as a series of cross-sectional views, in this case using a developed structure. In FIG. 4A, a dry-etch-resistant photopolymer layer 443 is shown provided over a substrate 440 having a support 441 and a layer of active organic material 442, e.g., an organic semiconductor.

Figure 4B:
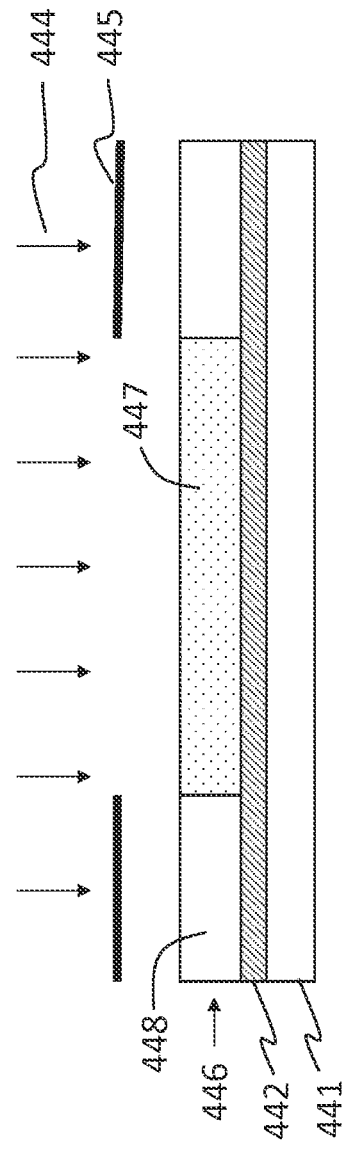

In FIG. 4B, the dry-etch-resistant photopolymer 443 is exposed to patterned radiation by providing a photomask 445 and a source of radiation 444, e.g., UV radiation. This forms an exposed photopolymer layer 446 having a first pattern of cross-linked photopolymer 447 and a complementary second pattern of unexposed photopolymer 448.

Figure 4C:
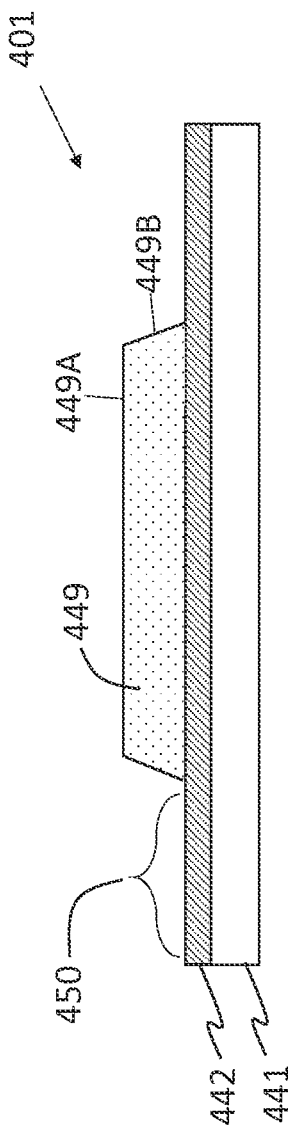

In FIG. 4C, a developed structure 401 is shown that is formed by contacting the exposed photopolymer layer 446 with a developing agent comprising a fluorinated solvent to remove the second pattern of unexposed photopolymer 448, leaving behind a first pattern of developed photopolymer 449 covering the active organic material layer 442 and a complementary second pattern of uncovered substrate 450. The first pattern of developed photopolymer 449 corresponds to the first pattern of cross-linked photopolymer 447, and the second pattern of uncovered substrate 450 corresponds to the second pattern of unexposed photopolymer 448, although the shapes may not be identical due to development/exposure effects. Further, in the present embodiment, the first pattern of developed photopolymer 449 is shown having outwardly sloping side walls 449B relative to the top surface 449A. In other embodiments, the sidewalls could be vertical, straight, curved, or inwardly sloping. The shape of the sidewalls is a function of the degree of cross-linking and development rate.

In FIG. 4D, a structure is shown after treatment with a dry etch gas 455. The etch gas has removed the active organic material in portions corresponding to the second pattern of uncovered substrate leaving a layer of patterned active organic material 451. The etch gas treatment forms a dielectric structure 452 having a surface region 453 comprising a higher density of dry-etch-resistant atoms than an interior region 454. In the present embodiment, both the top surface 449A and sidewalls 449B of the developed photopolymer have the higher density of dry-etch-resistant atoms. In other embodiments, e.g., where the sidewalls are vertical or slope inwardly, it may be that only the top surface has the higher density. Although surface region 453 and interior region 454 are shown as discrete portions or layers, the density of dry-etch-resistant atoms may instead have a gradient without a discrete boundary. In an embodiment, the surface region 453 has a high content of silicon oxide. In an embodiment, the surface region 453 has reduced fluorine content relative to the interior region 454 and improved adhesion to subsequently-applied layers. The dielectric structure may optionally be substantially transparent to visible light. In an embodiment, the dielectric structure has a permittivity in a range of 2 to 5.

FIG. 5 is a cross-sectional diagram of OTFT device 500 that may be prepared by combining some of the methods and structures discussed above. In FIG. 5, source 516 and drain 518 electrodes are provided over a support 541. A patterned organic semiconductor layer 551 covers the source and drain electrodes and a portion of the support 541. A first dielectric structure 552 is provided over the patterned organic semiconductor 551. The first dielectric structure 552 comprises a surface region 553 having a higher density of dry-etch-resistant atoms than an interior region 554. Gate electrode 520 is provided over first dielectric structure 552 which acts as a gate dielectric layer in this top gate, bottom contact OTFT structure.

A second dielectric structure 562 is provided over the first dielectric structure 552 and the exposed edge of the patterned organic semiconductor layer 551. The second dielectric structure 562 comprises a surface region 563 having a higher density of dry-etch-resistant atoms than an interior region 564. The second dielectric structure acts as a barrier layer that protects the OTFT device, e.g., from moisture. In an embodiment, surface regions 553 and 563 have a high content of silicon oxide.

Many variations of the above embodiment are possible. For example, the gate dielectric layer may include first and second stacked dielectric structures with the gate electrode over the second dielectric. The barrier layer may comprise multiple layers of dielectric structures. In an embodiment, the water vapor transmission rate through a barrier layer comprising the present dielectric structure is less than $10^{-5}$ g/m$^2$/day, preferably less than $10^{-6}$ g/m$^2$/day, under ambient temperature and humidity conditions. In an embodiment, the water vapor transmission rate through a barrier comprising the present dielectric structure is less than $10^{-2}$ g/m$^2$/day, preferably less than $10^{-3}$ g/m$^2$/day, in an accelerated test at 60° C./90% RH (relative humidity).

A bioelectronic device such as a biosensor, an ion pump, an electrochemical transistor, a drug delivery device and the like may use the present fluorinated photopolymer or dielectric structure as one or more structural or barrier layers. In some embodiments, e.g., implantable bioelectronic devices, such structural or barrier layers may be particularly beneficial.

EXAMPLES

Photopolymer Compositions 1-6

Synthesis of 2-cinnamoyloxyethyl Methacrylate (Compound C-8)

With ice bath cooling, a solution of 8.3 g (0.05 mol) cinnamoyl chloride and 10 mL of dry dimethylacetamide was slowly added to a stirred solution of 6.5 g (0.05 mol) 2-hydroxyethyl methacrylate and 14 mL of dry pyridine. When the addition was complete, the cooling bath was removed and the mixture warmed to ambient temperature over 3 hours. Water and ethyl acetate were added to the reaction mixture and the product was extracted into the organic layer. The organic layer was washed successively with 1N hydrochloric acid solution, saturated sodium bicarbonate solution and saturated sodium chloride solution, then dried over magnesium sulfate, and filtered. The solvent was removed under vacuum to give 12.1 g (93% of theoretical 13.0 g) of the monomer as a clear, yellow oil. NMR was used to verify the composition. The monomer was used without further purification in the polymerization step.

Synthesis of Photopolymer Composition 1

A clean, dry 250 mL, four-neck jacketed reactor was equipped with a Teflon-blade mechanical stirrer, a reflux condenser having a bubbler outlet, a nitrogen inlet (the height of which can be adjusted to be below the surface of the reaction solution), and a programmable constant temperature bath (CTB) attached to the reactor jacket. The reactor was charged with FOMA (21.750 g, 50.326 mmol), compound C-8 (9.174 g, 35.247 mmol), methacryloxypropyltris(trimethylsiloxy)silane (compound PR-3, 6.402 g, 15.140 mmol), AIBN (0.2005 g, 1.22 mmol.) and Novec™ 7600 solvent (119 g). The nitrogen inlet was placed below the surface of the solution, and with good stirring, the reaction solution was sparged with nitrogen for 1 hour. During the nitrogen sparge, the CTB was pre-warmed to 62° C. with flow to the reactor jacket turned off. When the sparge was complete, the gas inlet tube was raised above the solution level and the nitrogen flow was reduced to maintain a slight positive flow through the system during the reaction. The valves between the pre-heated CTB and the reactor were opened and the reaction solution was stirred with heating for 4.5 hours. The reaction mixture was cooled to 50° C. and drained from the reactor. Several portions of Novec™ 7600 solvent were used to rinse the reactor and these rinses were combined with the product solution that gave a total weight of 303.90 g (12.0 wt % polymer solution). The polymer was sensitized to h,i-line UV radiation by dissolving 2,4-diethyl-9H-thioxanthen-9-one (4.5 wt % relative to the dry weight of the polymer in solution) in the polymer solution. The sensitized polymer solution was filtered repeatedly using nitrogen pressure through a 0.05 micrometer cartridge filter to provide a particle-free solution for coating. The fluorine content of the photopolymer in Photopolymer Composition 1 was 33.3% by weight.

Synthesis of Photopolymer Composition 2

A clean, dry 40 mL vial was equipped with a magnetic stirrer, a nitrogen inlet that can be adjusted to be below the surface of the reaction solution, and a nitrogen outlet attached to a bubbler. The vial was charged with FOMA (1.8170 g, 4.20 mmol), compound C-8 (1.0387 g, 3.99 mmol) compound PR-3 (0.6405 g, 1.51 mmol), ethyleneglycol dimethacrylate ("EGDMA" 0.0214 g, 0.11 mmol), dodecanethiol ("DT" 0.0213 g, 0.11 mol), AIBN (0.0192 g, 0.12 mmol) and Novec™ 7600 solvent (14 g). The nitrogen inlet was placed below the surface of the solution and with good stirring the reaction solution was sparged with nitrogen for 30 minutes. When the sparge was complete the gas inlet tube was raised above the solution level and the nitrogen flow was reduced to maintain a slight positive flow through the system during the reaction. The vial was placed in a programmable oil-bath and the temperature was raised to 63° C. After heating for 4.5 hours, the reaction mixture was cooled to ambient temperature and diluted with Novec™ 7600 to give a total weight of 29.3651 g (15.88 wt % polymer solution). The photopolymer in this example is a branched polymer. The EGDMA provided branching points and DT was used as a chain transfer agent to control molecular weight. The polymer was sensitized to h,i-line UV radiation by dissolving 2,4-diethyl-9H-thioxanthen-9-one (4.5 wt % relative to the dry weight of the polymer in solution) in the polymer solution. The sensitized polymer solution was filtered repeatedly using nitrogen pressure through a 0.22 micrometer cartridge filter to provide a particle-free solution for coating. The fluorine content of the photopolymer in Photopolymer Composition 2 was 29.5% by weight.

Synthesis of 2-(4-perfluorohexylethyl-3-methoxycinnamoyloxy)ethyl Methacrylate (Compound C-1)

As a first step, perfluorohexylethyl triflate was prepared by the following procedure. A solution of perfluorohexyl ethyl alcohol (10.05 g, 0.0276 mol), triethylamine (4.7 mL, 3.41 g, 0.0337 mol), and 40 mL of dry dichloromethane was cooled in an acetone/ice bath. A solution of trifluoromethanesulfonic anhydride, (9.03 g, 0.0320 mol) and 20 mL of dry dichloromethane was added in a drop-wise manner at a rate such that the reaction temperature remained below 2° C. When the addition was complete, the cooling bath was removed and the reaction mixture was stirred at ambient temperature for 16 hours. The reaction mixture was then diluted with more dichloromethane and washed successively with 0.5 N HCl solution, saturated sodium bicarbonate solution, saturated sodium chloride solution and then dried over magnesium sulfate. The solvent was removed under vacuum while keeping the temperature to ambient or below, to give 13.9 g (101%) of a red oil that solidified when cooled. The composition was checked by 1H-NMR and showed the desired product along with trace contamination by triethylamine. This material was suitable for use in the fluoroalkylation reactions described below.

Next, 4-perfluorohexylethyl-5-methoxybenzaldehyde was prepared as follows. To a solution of 4-hydroxy-3-methoxybenzaldehyde (vanillin, 3.25 g, 0.0214 mol) and EtOAc, (20 mL) were added tetrabutylammonium bromide (0.1056 g, 0.327 mmol), powdered potassium carbonate (3.0295 g, 0.02192 mol) and perfluorohexylethyl triflate (11.68 g, 0.0235 mol). The resulting slurry was stirred at ambient temperature for 16 hours. The reaction mixture was diluted with more EtOAc and washed twice with 5% sodium hydroxide solution to remove trace of unreacted starting benzaldehyde, then successively with 0.5 N HCl solution, saturated sodium bicarbonate solution, saturated sodium chloride solution and then dried over magnesium sulfate. The solvent was removed under vacuum to give the desired product as a waxy solid. The composition was checked by 1H-NMR.

As a next step, 4-perfluorohexylethyl-3-methoxycinnamic acid was synthesized by the following procedure. A slurry of 4-perfluorohexylethyl-5-methoxybenzaldehyde (11.7 g, 0.0235 mol), malonic acid (5.0 g, 0.048 mol), pyridine (5 mL, 4.9 g, 0.062 mol) and piperidine (0.54 g, 6.34 mmol) was heated to 82° C. and stirred for 30 minutes while degassing occurred. The reaction mixture was then heated to 112° C. and stirred for a further 2 hours to complete the reaction. After cooling to ambient temperature, water (30 mL) was slowly added to the reaction mixture to precipitate a thick slurry. With ice-water cooling, concentrated hydrochloric acid (5 mL) was added slowly to acidify the slurry to a pH of about 1. The reaction mixture was filtered and washed with water until the pH of the washes was neutral. The solid was dried in a 50° C. vacuum oven for 16 hours and 10.5 g (91%) of solid was recovered. The melting point was determined to be 138-140° C. and 1H-NMR was used to verify composition. The purity of the product was suitable for use in the next reaction.

Next, oxaloyl chloride (4.99 g, 39.3 mmol) was slowly added to an ice cooled solution of 4-perfluorohexylethyl-3-methoxycinnamic acid (17.0 g, 31.5 mmol), 30 mL dry THF and 2.8 g dry dimethylacetamide. Foaming in the reaction mixture was controlled by adjusting the addition rate. When the addition was complete, the reaction mixture was stirred with cooling for 30 minutes and then warmed slowly to 40° C. After about 30 minutes the outgassing had stopped and the reaction mixture was cooled to ambient temperature. The solvent was removed under vacuum to give the acid chloride as a tan, solid residue. The yield was theoretical including the dimethylacetamide used in the reaction. The product was used in the next stage of the reaction without further purification.

The target monomer, compound C-1, was then prepared as follows. A solution of 2-hydroxyethyl methacrylate (4.1 g, 31.5 mmol) and dry pyridine, (10 mL) was cooled with an ice bath and 4-perfluorohexylethyl-3-methoxycinnamoyl chloride (19 g, 31.5 mmol) was added in portions with cooling between each addition. Dimethylacetamide (10 mL) was used to rinse the flask and it was then added to the reaction mixture. The cooling bath was removed and the reaction mixture was stirred at ambient temperature for 16 hours. Water (100 mL) was added to the reaction mixture with ice cooling. The product was extracted into diethyl ether (100 mL). The aqueous layer was removed and the ether layer was washed twice with 1N hydrochloric acid solution (75 mL), saturated sodium bicarbonate solution (75 mL) and then with saturated sodium chloride solution (75 mL). The organic layer was dried over magnesium sulfate, filtered and the solvent was removed under vacuum. Care must be used when removing the solvent to control foaming. A total of 15.6 g of a deep-red oil, was recovered (76% of 20.5 g theoretical yield). The composition was verified by 1H-NMR and the purity was acceptable for use as a polymerizable monomer.

Synthesis of Photopolymer Composition 3

A solution of compound C-1 (3.12 g, 4.79 mmol), FOMA (2.17 g, 5.02 mmol), AIBN (0.0216 g, 0.13 mmol) and trifluorotoluene (23.44 g) was sparged with nitrogen for 30 minutes and then heated to 63° C. for 4.5 hours. After cooling to ambient temperature, the reaction mixture was precipitated in cold methanol (50 mL), washed twice with cold methanol and then dried at 50° C. under reduced pressure to give the copolymer as an orange solid. A solution of this polymer was prepared by dissolving 1.0036 g in 9.0172 g of Novec™ 7600 solvent. No sensitizing dye was added. The solution was spin-coated on Si-wafer at 1000 rpm. The resulting film had a thickness of approximately 0.75 μm. The fluorine content of the photopolymer in Photopolymer Composition 3 was 50.9% by weight.

Synthesis of Photopolymer Composition 4

In a manner similar to that used for Photopolymer Composition 3, Photopolymer Composition 4 was prepared including a photopolymer having a FOMA/C-1 mole % ratio of 30/70, respectively, and a fluorine content of 46.8% by weight.

Synthesis of Photopolymer Composition 5

In a manner similar to that used for Photopolymer Composition 3, Photopolymer Composition 5 was prepared including a photopolymer having a FOMA/C-1 mole % ratio of 10/90, respectively, and a fluorine content of 41.4% by weight.

Synthesis of Photopolymer Composition 6

In a manner similar to that used for Photopolymer Composition 1, a photopolymer was prepared from four monomers: FOMA/C-8/PR-3/t-butylmethacrylate (TBMA) in a mole % ratio of 40/35.1/15/9.9, respectively, having a fluorine content of 28.9% by weight. A coatable composition included Novec™ 7600 solvent and the sensitizer 2,4-diethyl-9H-thioxanthen-9-one at 4.5% by weight relative to the dry weight of the photopolymer.

Coating and Performance of Photopolymer Compositions 1-6

The photopolymer compositions were individually spin-coated on 150 mm silicon wafers that had been pre-primed with HMDS vapor and baked at 90° C. for 60 seconds. Film thicknesses were typically in a range of about 0.5 to 2.0 μm when spun at 1000 rpm, but can be adjusted by spin speed or composition viscosity. The wafers were exposed to patterned actinic radiation at 365 nm wavelength at a series of increasing doses starting at 40 mJ/cm$^2$ to yield photo cross-linked polymers. In a test using a patterned mask, Photopolymer Compositions 1, 3, 4, 5 and 6 showed substantial cross-linking even at the lowest dose tried, 40 mJ/cm$^2$. When developed with Novec™ 7600, Compositions 1-4 yielded imaged films, although composition 5 did not clear well even in the low exposure areas, presumably due high photosensitivity. Photopolymer Composition 2 required about 300 mJ/cm$^2$ to achieve cross-linking sufficient to fully withstand sustained development in Novec™ 7600, but showed very good (sharp) line shape.

Film thickness after 60 sec development in Novec™ 7600 was determined as a function of exposure for Composition 1, 2 and 6 using a step tablet and uniform exposure (using a different exposure device than the one above). Table 1 shows the exposure dose that maintains 50% of the film thickness after the 60 sec development ("0.5 speed point"). It also shows the slope of the thickness vs log(exposure dose) at the 0.5 speed point ("0.5 contrast"). One can see that Compositions 1 and 6 require lower exposure dose than Composition 2 at the 0.5 speed point. On the other hand, the contrast of the branched polymer Composition 2 is about twice that of Compositions 1 and 6. Higher contrast often results in sharper line shape, consistent with the observed patterning experiment above.

TABLE 1

| Photopolymer Composition | 0.5 speed point (mJ/cm$^2$) | 0.5 contrast |
| --- | --- | --- |
| 1 | 14.9 | 0.43 |
| 2 | 179 | 1.06 |
| 6 | 15.5 | 0.58 |

The wettability of the fluorinated photopolymers can sometimes be an important property to control. In some embodiments, an organic coating may be provided over a layer of fluorinated photopolymer. If the organic coating solution has a contact angle that is too high on the layer of fluorinated photopolymer (poor wettability), the coating may be non-uniform or bead up. It has been found that the contact angle of mesitylene (an organic solvent) on fluorinated photopolymers of the present disclosure can be reduced by decreasing total fluorine weight percentage or especially by adding branching. Table 2 shows contact angle of mesitylene on unexposed layers of Compositions 1, 2 and 6.

TABLE 2

| Photopolymer Composition | Weight % F relative to polymer | Branching? | Mesitylene contact angle |
| --- | --- | --- | --- |
| 1 | 33% | No | 36° |
| 2 | 29.5% | Yes | 8° |
| 6 | 28.9% | No | 17° |

Photopolymer Composition 7

Photopolymer Composition 7 was prepared in a manner similar to Photopolymer Composition 3 except that the photopolymer was formed from the monomers FOMA/C-1/PR-3 in a mole % ratio of 50/35/15, respectively, producing a photopolymer having a fluorine content of 42.8% by weight. No sensitizing dye was added. This composition was slightly cloudy even after filtration but still formed reasonable films. A film formed from Photopolymer Composition 7 was exposed to patterned actinic radiation at 365 nm wavelength at a series of increasing doses starting at 40 mJ/cm$^2$. The pattern was developed by contact with two (2) 45 sec puddles of HFE-6512. Exposure doses higher than 54 mJ/cm$^2$ produced sufficient cross-linking to form a patterned image.

Photopolymer Composition 8

Photopolymer Composition 8 was prepared in a manner similar to Photopolymer Composition 3 except that the photopolymer was formed from the monomers FOMA/C-1/PR-3/IBMA (isobornyl methacrylate) in a mole % ratio of 50/30/10/10, respectively, producing a photopolymer having a fluorine content of 42.8% by weight. No sensitizing dye was added. This composition was slightly cloudy even after filtration but still formed reasonable films. A film formed from Photopolymer Composition 8 was exposed to patterned actinic radiation at 365 nm wavelength at a series of increasing doses starting at 40 mJ/cm$^2$. The pattern was developed by contact with two (2) 45 sec puddles of HFE-6512. Even the lowest exposure of 40 mJ/cm$^2$ produced sufficient cross-linking to form a patterned image.

Photopolymer Composition 9

Photopolymer Composition 9 was like Photopolymer Composition 2 except that no sensitizing dye was added. A film formed from Photopolymer Composition 9 was exposed to patterned actinic radiation at 365 nm wavelength at a series of increasing doses starting at 40 mJ/cm$^2$ up to 2.5 J/cm$^2$. When contacted with Novec™ 7600 no image formed, i.e., there is insufficient cross-linking at 365 nm without a sensitizing dye to form a patterned image below 2.5 J/cm$^2$. Exposure to 254 nm radiation does cross-link the photopolymer without a sensitizing dye.

Photopolymer Composition 10

Photopolymer Composition 10 was like Photopolymer Composition 2 except that a different sensitizing dye was added, 13FBNzph, at the same molar ratio of dye to photopolymer.

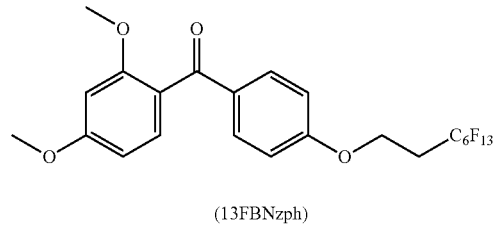

(13FBNzph)

A film formed from Photopolymer Composition 10 was exposed to patterned actinic radiation at 365 nm wavelength at a series of increasing doses starting at 40 mJ/cm$^2$. The pattern was developed by contact with Novec™ 7600. Exposure doses higher than 537 mJ/cm$^2$ produced sufficient cross-linking to form a patterned image. Although not as efficient as 2,4-diethyl-9H-thioxanthen-9-one, 13FBNzph is an effective sensitizing dye.

Photopolymer Composition 11

Photopolymer Composition 11 was prepared in a manner similar to Photopolymer Composition 2 except that the photopolymer was formed from the monomers FOMA/C-8/PR-3/EGDMA/TX2CMA in a mole % ratio of 46/36/15/1/5, respectively, producing a photopolymer having a fluorine content of 29.2% by weight. TX2CMA is a copolymerizable sensitizing dye having the structure shown below.

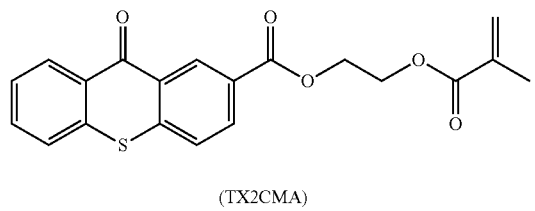 [SMILES: C=C(C)C(=O)OCCOC(=O)c1ccc2sc3ccccc3c(=O)c2c1]

(TX2CMA)

A film formed from Photopolymer Composition 11 was exposed to patterned actinic radiation at 365 nm wavelength at a series of increasing doses starting at 40 mJ/cm$^2$. The pattern was developed by contact with Novec™ 7600. Exposure doses higher than 124 mJ/cm$^2$ produced sufficient cross-linking to form a patterned image. Thus, this "attached" sensitizing dye is effective at sensitizing the cross-linking reaction at 365 nm.

Photopolymer Composition 12

Photopolymer Composition 12 was prepared in a manner similar to Photopolymer Composition 12 except that the photopolymer was formed from the monomers FOMA/C-8/PR-3/EGDMA/TX2CMA in a mole % ratio of 46/31/10/1/10, respectively, producing a photopolymer having a fluorine content of 28.8% by weight. A film formed from Photopolymer Composition 12 was exposed to patterned actinic radiation at 365 nm wavelength at a series of increasing doses starting at 40 mJ/cm$^2$. The pattern was developed by contact with Novec™ 7600. Exposure doses higher than 204 mJ/cm$^2$ produced sufficient cross-linking to form a patterned image. Although Composition 12 had more sensitizing dye than Composition 11, it has slightly reduced photo cross-linking efficiency. This may be due to the reduced amount of C-8.

Photopolymer Composition 13

Photopolymer Composition 13 was prepared in a manner similar to Photopolymer Composition 1 except that the photopolymer was formed from the monomers FOMA/C-8 in a mole % ratio of 70/30, respectively, producing a photopolymer having a fluorine content of 45.4% by weight. Sensitizing dye 2,4-diethyl-9H-thioxanthen-9-one was added at 4.5% by weight relative to the photopolymer. A film formed from Photopolymer Composition 13 was exposed to patterned actinic radiation at 365 nm wavelength at 1 J/cm$^2$. The pattern was readily developed by contact with two (2) 45 sec puddles of Novec™ 7600. Although exposure doses less than this were not tried, it is likely lower doses would be effective as well.

Photopolymer Composition 14

Photopolymer Composition 14 was prepared in a manner similar to Photopolymer Composition 1 except that the photopolymer was formed from the monomers FOMA/C-8 in a mole % ratio of 50/50, respectively, producing a photopolymer having a fluorine content of 35.6% by weight. Sensitizing dye 2,4-diethyl-9H-thioxanthen-9-one was added at 4.5% by weight relative to the photopolymer. A film formed from Photopolymer Composition 14 was exposed to patterned actinic radiation at 365 nm wavelength at 1 J/cm$^2$. The pattern was readily developed by contact with two (2) 45 sec puddles of Novec™ 7600. Although exposure doses less than this were not tried, it is likely lower doses would be effective as well.

Photopolymer Composition 15

Photopolymer Composition 15 was attempted to be prepared in a manner similar to Photopolymer Composition 1 except that the photopolymer was formed from the monomers FOMA/C-8 in a mole % ratio of 30/70, respectively, producing a photopolymer having a fluorine content of 23.7% by weight. However, this photopolymer was not sufficiently soluble in Novec™ 7600 to prepare a useful coating solution. It is believed that the amount of fluorination was insufficient in this particular system, and in certain embodiments, the fluorine content should be at least 25% by weight relative to the photopolymer.

Photopolymer Compositions 16-18

Photopolymer Compositions 16-18 were prepared in a manner similar to Photopolymer Composition 1 to provide a level series of dry-etch resistant monomer PR-3. In the case of Photopolymer Composition 16, the photopolymer was formed from the monomers FOMA/C-8/PR-3 in a mole % ratio of 50.0/40.1/9.9, respectively, producing a photopolymer having a fluorine content of 34.0% by weight. In the case of Photopolymer Composition 17, the photopolymer was formed from the monomers FOMA/C-8/PR-3 in a mole % ratio of 49.8/34.8/15.4, respectively, producing a photopolymer having a fluorine content of 33.2% by weight. In the case of Photopolymer Composition 18, the photopolymer was formed from the monomers FOMA/C-8/PR-3 in a mole % ratio of 50.0/29.9/20.1, respectively, producing a photopolymer having a fluorine content of 32.6% by weight. Rather than using 2,4-diethyl-9H-thioxanthen-9-one as the sensitizing dye, trifluoromethylthioxanthone was used. In this case, sensitizing dye was sparingly soluble so that the compositions were essentially saturated, but at an unknown specific concentration.

Films formed from these compositions were exposed to patterned actinic radiation at 365 nm wavelength at a series of increasing doses starting at 40 mJ/cm$^2$. The pattern was developed by contact with Novec™ 7600. Exposure doses higher than 390, 334 and 334 mJ/cm$^2$ produced sufficient cross-linking to form a patterned image in Compositions 16, 17 and 18, respectively. Even though the sensitizing dye was sparingly soluble, it was effective at promoting cross-linking.

Films formed from these compositions were also studied to determine their etch resistance. These compositions, along with HPR-504, a commercially available photoresist from Fujifilm, were coated on Si wafers to form films having a thickness of about 1.2 μm. The films were subjected to oxygen plasma (oxygen gas flow of 50 sccm, 100 mTorr vacuum, 100 W) in 30 sec increments and the film thicknesses were re-measured. The change in thickness from the previous measurement was used to calculate an etch rate in nm/sec. The data are summarized in Table 3.

TABLE 3

Etch rates for HPR-504 and Photopolymer Compositions 16-18

| Composition | Polymer etch rates (nm/sec) calculated at various etch times | | | | |
| --- | --- | --- | --- | --- | --- |
| | @ 30 sec | @ 60 sec | @ 90 sec | @ 120 sec | Ave 60-120 sec |
| HPR-504 | 316 | 281 | 292 | 295 | 289 |
| 16 | 751 | 357 | 307 | 293 | 319 |
| 17 | 254 | 138 | 154 | 99 | 131 |
| 18 | 102 | 26 | 14 | 75 | 38 |

From the data in Table 3, one can see that the conventional photoresist HPR-504 has a constant etch rate over 120 sec. Photopolymer Compositions 16 through 18 show a different behavior. The initial etch rates (i.e., @ 30 sec) are substantially higher than they are at subsequent times. The average etch rate for these films from 60 sec to 120 sec is roughly half or less as compared to the 30 sec etch rate values. These observations provide evidence for the formation of a dielectric structure having a surface region that is higher in content of silicon oxide (lower in carbon & fluorine), which substantially slows the etch rate.

Photo cross-linked polymers of the present disclosure have been shown to be resistant to strong organic solvents such as acetone and THF.

REPRESENTATIVE EMBODIMENTS

Some non-limiting, representative embodiments of the present disclosure are described below.

Embodiment Group A

1. A photosensitive composition comprising:
a fluorinated photo cross-linkable polymer comprising at least a repeating unit having a fluorine-containing cinnamate group, wherein the polymer has a total fluorine content in a range of 20 to 60% by weight; and
a fluorinated solvent.

2. The composition of embodiment 1 wherein the polymer comprises a structure according to formula (1):

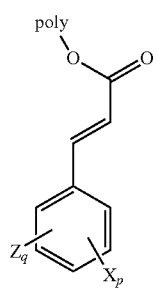

(1)

wherein p is an integer from 1 to 5, X is an independently selected fluorine-containing alkyl, alkoxy, alkylthio, aryl, aryloxy, alkanoate, benzoate, alkyl ester, aryl ester, or alkanone; q is an integer from 0 to 4 such that q+p≤5, Z is an independently selected alkyl, alkoxy, alkylthio, aryl, aryloxy, alkanoate, benzoate, alkyl ester, aryl ester, or alkanone; and "poly" represents a polymer chain including any optional linking groups between the fluorinated cinnamate group and the polymer chain.

3. The composition according to embodiment 2 wherein the weight percent of the structure according to formula (1), not including the weight contribution from "poly", accounts for at least 25% of the total polymer weight.

4. The composition according to any of embodiments 1-3 wherein the fluorinated solvent is a hydrofluoroether.

5. The composition according to embodiment 4 wherein the hydrofluoroether has a boiling point in a range of 100° C. to 175° C.

6. The composition according to any of embodiments 1-5 wherein the photo cross-linkable polymer is formed from a polymerization reaction including one or more acrylate-based monomers.

7. The composition according to any of embodiments 1-6 wherein the photo cross-linkable polymer further includes one or more alkyl-containing repeating units.

8. A device comprising a layer formed from a fluorinated photo cross-linkable polymer comprising at least a repeating unit having a fluorine-containing cinnamate group, wherein the polymer has a total fluorine content in a weight range of 20 to 60%.

9. The device according to embodiment 8 wherein the polymer comprises a structure according to formula (1):

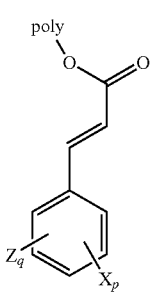

(1)

wherein p is an integer from 1 to 5, X is an independently selected fluorine-containing alkyl, alkoxy, alkylthio, aryl, aryloxy, alkanoate, benzoate, alkyl ester, aryl ester, or alkanone; q is an integer from 0 to 4 such that q+p≤5, Z is an independently selected alkyl, alkoxy, alkylthio, aryl, aryloxy, alkanoate, benzoate, alkyl ester, aryl ester, or alkanone; and "poly" represents a polymer chain including any optional linking groups between the fluorinated cinnamate group and the polymer chain.

Embodiment Group B

1. A photosensitive composition comprising:
a fluorinated photo cross-linkable polymer comprising a first repeating unit having a fluorine-containing group but not a cinnamate group, and a second repeating unit having a fluorine-containing cinnamate group, wherein the polymer has a total fluorine content in a range of 30 to 60% by weight; and
a fluorinated solvent.

2. The composition of embodiment 1 wherein the second repeating unit comprises a structure according to formula (1):

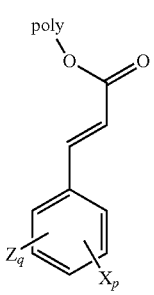

(1)

wherein p is an integer from 1 to 5, X is an independently selected fluorine-containing alkyl, alkoxy, alkylthio, aryl, aryloxy, alkanoate, benzoate, alkyl ester, aryl ester, or alkanone; q is an integer from 0 to 4 such that q+p≤5, Z is an independently selected alkyl, alkoxy, alkylthio, aryl, aryloxy, alkanoate, benzoate, alkyl ester, aryl ester, or alkanone; and "poly" represents a polymer chain including any optional linking groups between the fluorinated cinnamate group and the polymer chain.

3. The composition according to embodiment 2 wherein the mole ratio of the first repeating unit to the second repeating unit is in a range of 0.1 to 10.

4. The composition according to embodiment 3 wherein the mole ratio of the first repeating unit to the second repeating unit is in a range of 0.25 to 4.

5. The composition according to any of embodiments 1-4 wherein the fluorinated solvent is a hydrofluoroether.

6. The composition according to embodiment 5 wherein the hydrofluoroether has a boiling point in a range of 100° C. to 175° C.

7. The composition according to any of embodiments 1-6 further comprising a third repeating unit having a dry-etch-resistant group.

8. The composition according to embodiment 7 wherein the dry-etch-resistant group includes at least one Si atom.

9. The composition according to embodiment 7 or 8 wherein the mole ratio of the third repeating unit relative to the combined first and second repeating units is in a range of 0.1 to 1.

10. The composition according to any of embodiments 1-9 wherein the photo cross-linkable polymer is formed from a polymerization reaction including one or more acrylate-based monomers.

11. A device comprising a layer formed from a photo cross-linkable polymer comprising a first repeating unit having a fluorine-containing group but not a cinnamate group, and a second repeating unit having a fluorine-containing cinnamate group, wherein the polymer has a total fluorine content in a range of 30 to 60% by weight.

12. The device according to embodiment 11 wherein the second repeating unit comprises a structure according to formula (1):

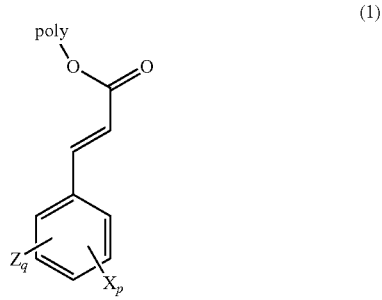

wherein p is an integer from 1 to 5, X is an independently selected fluorine-containing alkyl, alkoxy, alkylthio, aryl, aryloxy, alkanoate, benzoate, alkyl ester, aryl ester, or alkanone; q is an integer from 0 to 4 such that q+p≤5, Z is an independently selected alkyl, alkoxy, alkylthio, aryl, aryloxy, alkanoate, benzoate, alkyl ester, aryl ester, or alkanone; and "poly" represents a polymer chain including any optional linking groups between the fluorinated cinnamate group and the polymer chain.

Embodiment Group C

1. A photosensitive composition comprising:
a fluorinated photo cross-linkable polymer comprising at least a first repeating unit having a fluorine-containing group and a second repeating unit having a cinnamate group; and
a hydrofluoroether solvent.

2. The composition of embodiment 1 further comprising a third repeating unit having a dry-etch-resistant group including at least one dry-etch-resistant atom having an atomic weight of at least 24.

3. The composition of embodiment 2 wherein the dry-etch-resistant atom is selected from the group consisting of Si, Ti, Ge, Al, Zr, and Sn.

4. The composition according to embodiment 2 or 3 wherein the dry-etch-resistant group includes at least one Si atom.

5. The composition according to any of embodiments 2-4 wherein the mole ratio of the third repeating unit relative to the combined first and second repeating units is in a range of 0.1 to 1.

6. The composition according to any of embodiments 1-5 further comprising an additional repeating unit having a non-fluorinated alkyl group in a mole ratio in a range of 0.05 to 0.25 relative to the combined total of all other repeating units.

7. The composition according to any of embodiments 1-6 wherein the photo cross-linkable polymer is formed from a polymerization reaction including one or more acrylate-based monomers.

8. The composition according to any of embodiments 1-7 wherein the photo cross-linkable polymer has a total fluorine content in a range of 20 to 55% by weight.

9. The composition according to embodiment 8 wherein the photo cross-linkable polymer has a total fluorine content in a range of 25 to 50% by weight.

10. The composition according to any of embodiments 1-9 wherein the hydrofluoroether has a boiling point in a range of 100° C. to 150° C.

11. The composition according to any of embodiment 1-10 wherein the second repeating unit comprises a structure according to formula (2):

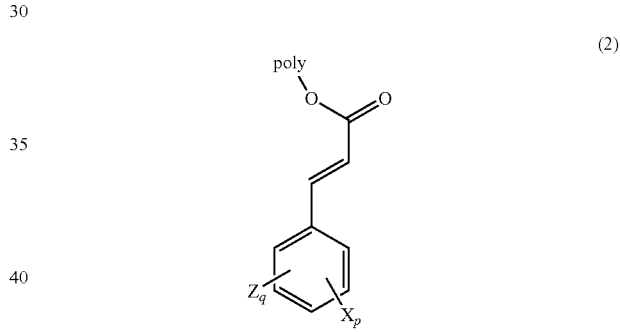

wherein p is an integer from 0 to 5, X is an independently selected fluorine-containing alkyl, alkoxy, alkylthio, aryl, aryloxy, alkanoate, benzoate, alkyl ester, aryl ester, or alkanone; q is an integer from 0 to 5 such that q+p≤5, Z is an independently selected alkyl, alkoxy, alkylthio, aryl, aryloxy, alkanoate, benzoate, alkyl ester, aryl ester, or alkanone; and "poly" represents a polymer chain including any optional linking groups between the cinnamate group and the polymer chain.

12. The composition according to any of embodiments 1-11 wherein the cinnamate group does include any fluorinated groups.

Embodiment Group D

1. A method of processing a fluorinated photo cross-linkable polymer, comprising:
forming a photopolymer layer on a substrate, the photopolymer layer including a photo cross-linkable polymer according to any of Embodiment Groups A, B or C;
exposing the photopolymer layer to patterned radiation to form an exposed photopolymer layer; and
contacting the exposed photopolymer layer with a developing agent to remove a portion of the exposed photopolymer layer in accordance with the patterned light, thereby forming a developed structure having a first pattern of cross-linked photopolymer covering the substrate and a complementary second pattern of uncovered substrate corresponding to the removed portion of polymer, the developing agent comprising at least 50% by volume of a fluorinated developing solvent.

2. The method according to embodiment 1 wherein the fluorinated developing solvent is a hydrofluoroether.

3. The method of embodiment 1 or 2 wherein the substrate comprises an active organic material layer in contact with the photopolymer layer.

4. The method of embodiment 3 further comprising the step of etching the active organic material layer in the second pattern of uncovered substrate wherein the first pattern of cross-linked photopolymer acts as an etch barrier.

5. The method of embodiment 4 wherein the etching includes a wet etch that solubilizes the active organic material in the second pattern of uncovered substrate.

6. The method of embodiment 4 wherein the etching includes a dry-etch that removes the active organic material in the second pattern of uncovered substrate.

Embodiment Group E

1. A method of forming a dielectric structure comprising:
providing a first photopolymer layer over a substrate, the first photopolymer layer comprising a first photo cross-linkable polymer having at least a first repeating unit having a fluorine-containing group, a second repeating unit having a photo cross-linkable group and a third repeating having a dry-etch-resistant group including at least one dry-etch-resistant atom having an atomic weight of at least 24;
exposing the first photopolymer layer to radiation to form a cross-linked first polymer; and
subjecting the cross-linked first polymer to a dry etching gas to form a first dielectric structure having a surface region comprising a higher density of dry-etch-resistant atoms than an interior region.

2. The method according to embodiment 1 wherein the radiation is patterned radiation that forms a first pattern of exposed polymer and a complementary second pattern of unexposed polymer, and further comprising the step of contacting the exposed photopolymer layer with a developing agent comprising a fluorinated solvent to remove the second pattern of unexposed polymer thereby forming a first developed structure, such first developed structure comprising the cross-linked first polymer that is subjected to the dry etching gas.

3. The method according to any of embodiments 1-2 further comprising:
providing a second photopolymer layer over the first dielectric structure, the second photopolymer layer comprising a second photo cross-linkable polymer having at least a first repeating unit having a fluorine-containing group, a second repeating unit having a photo cross-linkable group and a third repeating having a dry-etch-resistant group including least one dry-etch-resistant atom having an atomic weight of at least 24;
exposing the second photopolymer layer to second radiation to form a cross-linked second polymer; and
subjecting the cross-linked second polymer to a second dry etching gas to form a second dielectric structure having a surface region comprising a higher density of dry-etch-resistant atoms than an interior region.

4 The method according to embodiment 3 wherein the second radiation is patterned radiation that forms a third pattern of exposed second polymer and a complementary fourth pattern of unexposed second polymer, and further comprising the step of contacting the exposed second photopolymer layer with a developing agent comprising a fluorinated solvent to remove the fourth pattern of unexposed polymer thereby forming a second developed structure, such second developed structure comprising the cross-linked second polymer that is subjected to the second dry etching gas.

5. The method according embodiment 3 or 4 wherein the second photo cross-linkable polymer has substantially the same chemical composition as the first photo cross-linkable polymer.

6. The method according to any of embodiments 1-5 wherein the substrate comprises an organic semiconductor layer and the first photopolymer layer is provided in direct contact with the organic semiconductor.

7. The method according to any of embodiments 1-6 wherein at least one dielectric structure forms at least a portion of a gate dielectric in an organic thin film transistor and has a permittivity in a range of 2 to 5.

8. The method according to any of embodiments 1-7 wherein at least one dielectric structure acts as a moisture barrier having a water vapor penetration rate of less than $10^{-5}$ g/m²/day under ambient temperature and humidity conditions.

9. The method according to any of embodiments 1-8 wherein the photo cross-linkable group of at least one photo cross-linkable polymer is an acid-catalyzed epoxy group or a non-acid-catalyzed cinnamate that optionally includes a fluorine substituent.

10. The method according to any of embodiments 1-9 wherein at least one dielectric structure forms a bank or well structure in a display device.

11. The method according to any of embodiments 1-9 wherein at least one dielectric structure forms a portion of a touch screen device.

12. The method according to any of embodiments 1-11 further comprising patterning a metal layer over at least one dielectric structure.

13. The method according to any of embodiments 1-12 wherein at least one photo cross-linkable polymer has a total fluorine content in a weight range of 15 to 60%.

14. The method according to any of embodiments 1-13 wherein the mole ratio of the first repeating unit to the second repeating unit of at least one photo cross-linkable polymer is in a range of 0.1 to 10.

15. The method according to embodiment 14 wherein the mole ratio of the first repeating unit to the second repeating unit of at least one photo cross-linkable polymer is in a range of 0.25 to 4.

16. The method according to any of embodiments 1-15 wherein the mole ratio of the third repeating unit relative to the combined first and second repeating units for at least one photo cross-linkable polymer is in a range of 0.1 to 1.

17. The method according to any of embodiments 1-16 wherein the dry-etch-resistant atom for at least one photo cross-linkable polymer is selected from the group consisting of Si, Ti, Ge, Al, Zr, and Sn.

18. The method according to any of embodiments 1-17 wherein the dry-etch-resistant group includes at least one Si atom.

19. A device comprising a dielectric structure formed according to any of methods 1-18.

The invention has been described in detail with particular reference to certain preferred embodiments thereof, but it will be understood that variations, combinations, and modifications can be effected by a person of ordinary skill in the art within the spirit and scope of the invention.

LIST OF REFERENCE NUMBERS USED IN THE DRAWINGS 2 form photopolymer layer on substrate step
4 form exposed photopolymer layer step
6 form developed structure step
10 substrate
12 organic semiconductor material layer
14 gate dielectric material layer
16 source electrode
18 drain electrode
20 gate electrode
302 form dry-etch-resistant photopolymer layer on substrate step
304 form exposed dry-etch-resistant photopolymer layer step
306 optionally form developed structure step
308 treat with dry etch gas step
401 developed structure
440 substrate
441 support
442 active organic material layer
443 dry-etch-resistant photopolymer layer
444 radiation
445 photomask
446 exposed photopolymer layer
447 first pattern of cross-linked photopolymer
448 second pattern of unexposed photopolymer
449 first pattern of developed photopolymer
449A top surface of developed photopolymer
449B outwardly sloping sidewalls of developed photopolymer
450 second pattern of uncovered substrate
451 patterned active organic material layer
452 dielectric structure
453 surface region of dielectric structure
454 interior region of dielectric structure
455 dry etch gas
500 OTFT device
516 source electrode
518 drain electrode
520 gate electrode
541 support
551 patterned organic semiconductor layer
552 first dielectric structure
553 surface region of first dielectric structure
554 interior region of first dielectric structure
562 second dielectric structure
563 surface region of second dielectric structure
564 interior region of second dielectric structure

The invention claimed is:

1. A method of patterning a device comprising:
providing a substrate having a layer of active organic material;
forming a first pattern of a branched fluorinated polymer over the layer of active organic material; and
removing by dry-etching a second pattern of active organic material corresponding to portions not covered by the first pattern of branched fluorinated polymer, wherein
the branched fluorinated polymer comprises:
i) a fluorine-containing group; and
ii) a dry-etch-resistant group including at least one element having an atomic weight of at least 24.

2. The method of claim 1 wherein the dry-etch-resistant atom is Si, Ti, Ge, Al, Zr or Sn.

3. The method of claim 1 wherein the dry-etch-resistant groups are silane or siloxane groups.

4. The method of claim 3 wherein the dry-etch resistant groups are provided from a polymerizable monomer having a structure according to formula (3):

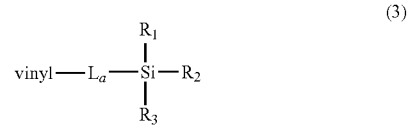

(3)

wherein, $R_1$ through $R_3$ are independently selected alkyl, aryl, alkoxy, aryloxy, siloxy groups, a=0 or 1, and L is linking group connecting a polymerizable vinyl moiety to the Si atom.

5. The method of claim 4 wherein the polymerizable monomer is selected from the group consisting of:

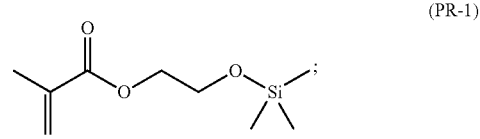
(PR-1)

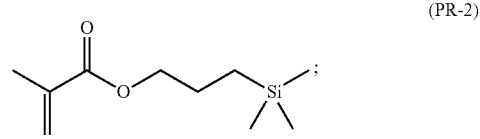
(PR-2)

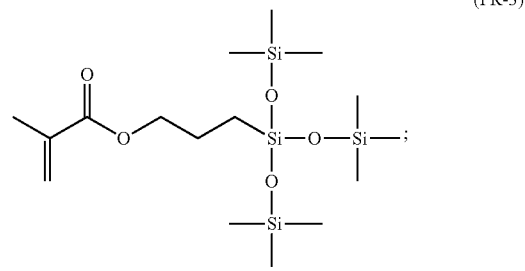
(PR-3)

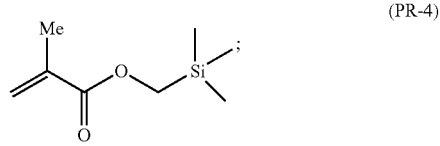
(PR-4)

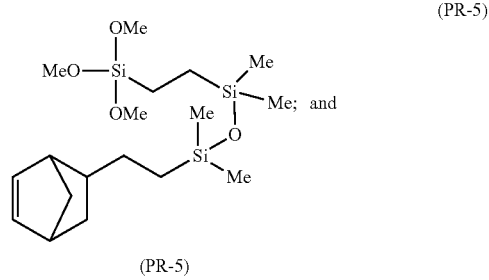
(PR-5)

(PR-5)

-continued

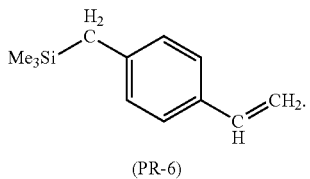

(PR-6)

6. The method of claim 1 wherein the branched fluorinated polymer has a total fluorine content in a arrange of 20 to 60% by weight.

7. The method of claim 1 wherein the active organic material includes an organic semiconductor or an organic conductor.

8. The method of claim 1 wherein the dry-etching includes oxygen plasma etching, argon plasma etching or UV/ozone etching.

9. The method of claim 1, wherein providing the first pattern of branched fluorinated polymer comprises:
   forming a branched fluorinated photopolymer layer over the substrate;
   exposing the branched fluorinated photopolymer layer to patterned radiation to form an exposed branched fluorinated photopolymer layer; and
   contacting the exposed branched fluorinated photopolymer layer with a developing agent comprising a fluorinated solvent, thereby forming.

10. The method of claim 1, wherein providing the first pattern of branched fluorinated polymer comprises application of a photopolymer composition by ink jet or flexography.

11. The method of claim 1, wherein providing the first pattern of branched fluorinated polymer comprises lamination transfer of a preformed fluorinated photopolymer layer from a carrier sheet.

* * * * *